(12) United States Patent
Hiraga

(10) Patent No.: US 10,551,422 B2
(45) Date of Patent: Feb. 4, 2020

(54) METHOD OF EVALUATING DEVICE INCLUDING NOISE SOURCE

(71) Applicant: Rohm Co., Ltd., Kyoto (JP)

(72) Inventor: Noriaki Hiraga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 711 days.

(21) Appl. No.: 14/506,853

(22) Filed: Oct. 6, 2014

(65) Prior Publication Data

US 2015/0097575 A1    Apr. 9, 2015

(30) Foreign Application Priority Data

Oct. 9, 2013  (JP) ................................. 2013-211531

(51) Int. Cl.
  *G01R 31/00* (2006.01)
  *G01R 23/163* (2006.01)

(52) U.S. Cl.
  CPC .......... *G01R 31/002* (2013.01); *G01R 23/163* (2013.01)

(58) Field of Classification Search
  USPC ..... 324/537, 500, 762.02, 750.01, 520, 612, 324/647, 762.01, 763.01, 76.39; 702/58, 702/127, 66, 75, 76; 455/423; 714/733
  See application file for complete search history.

(56) References Cited

U.S. PATENT DOCUMENTS

| | | | | |
|---|---|---|---|---|
| 4,506,259 A | * | 3/1985 | Rhodes | G01R 31/024 219/481 |
| 7,483,501 B1 | * | 1/2009 | Michaels, Jr. | H04B 17/345 375/227 |
| 2003/0083857 A1 | * | 5/2003 | Takahashi | G06F 17/5036 703/18 |
| 2005/0194981 A1 | * | 9/2005 | Cole | G01R 27/28 324/615 |

FOREIGN PATENT DOCUMENTS

| | | |
|---|---|---|
| JP | 2007-278781 | 10/2007 |
| JP | 2009-210322 | 9/2009 |

OTHER PUBLICATIONS

Koyama Yoshinori, Semiconductor evaluation Device; Sep. 17, 2009; Denso Corp; G01R31/30.*

* cited by examiner

*Primary Examiner* — Nasima Monsur
(74) *Attorney, Agent, or Firm* — Fish & Richardson P.C.

(57) ABSTRACT

A method of evaluating a device includes a first electric circuit acting as a noise source and a second electric circuit which is likely to malfunction due to a noise signal. The method includes: obtaining malfunction frequency characteristics indicating magnitudes of a threshold noise signal causing malfunction of the second electric circuit; obtaining internal noise arrival frequency characteristics indicating magnitudes of an internal noise signal arriving at the second electric circuit from the first electric circuit; and comparing the malfunction frequency characteristics with the internal noise arrival frequency characteristics.

12 Claims, 21 Drawing Sheets

METHOD OF EVALUATING DEVICE INCLUDING NOISE SOURCE

CROSS-REFERENCE TO RELATED APPLICATIONS

This application is based upon and claims the benefit of priority from Japan Patent Applications No. 2013-211531, filed on Oct. 9, 2013, the entire contents of which are incorporated herein by reference.

TECHNICAL FIELD

The present disclosure relates to a method of evaluating a device including a noise source.

BACKGROUND

There has been conventionally known a DPI (Direct RF Power Injection) test as an evaluation method of an electric circuit.

However, device malfunction due to a noise source within devices has not sufficiently been evaluated so far.

SUMMARY

The present disclosure provides some embodiments of a method of evaluating a device, which is capable of correctly detecting device malfunction due to a noise source.

According to one embodiment of the present disclosure, there is provided a method of evaluating a device including a first electric circuit acting as a noise source and a second electric circuit caused to malfunction due to a noise signal, including: obtaining malfunction frequency characteristics indicating magnitudes of a threshold noise signal causing malfunction of the second electric circuit; obtaining internal noise arrival frequency characteristics indicating magnitudes of an internal noise signal arriving at the second electric circuit from the first electric circuit; and comparing the malfunction frequency characteristics with the internal noise arrival frequency characteristics.

According to another embodiment of the present disclosure, there is provided a device including a first electric circuit acting as a noise source and a second electric circuit caused to malfunction due to a noise signal, wherein the device is provided, along with data indicating relationship between magnitudes of an internal noise signal arriving at the second electric circuit from the first electric circuit and malfunction of the second electric circuit.

The above and other characteristics, elements, steps, advantages and features of the present disclosure will be more apparent when reading the following description and the accompanying drawings.

DETAILED DESCRIPTION

<DPI Test (First Exemplary Configuration)>

Figure 1:
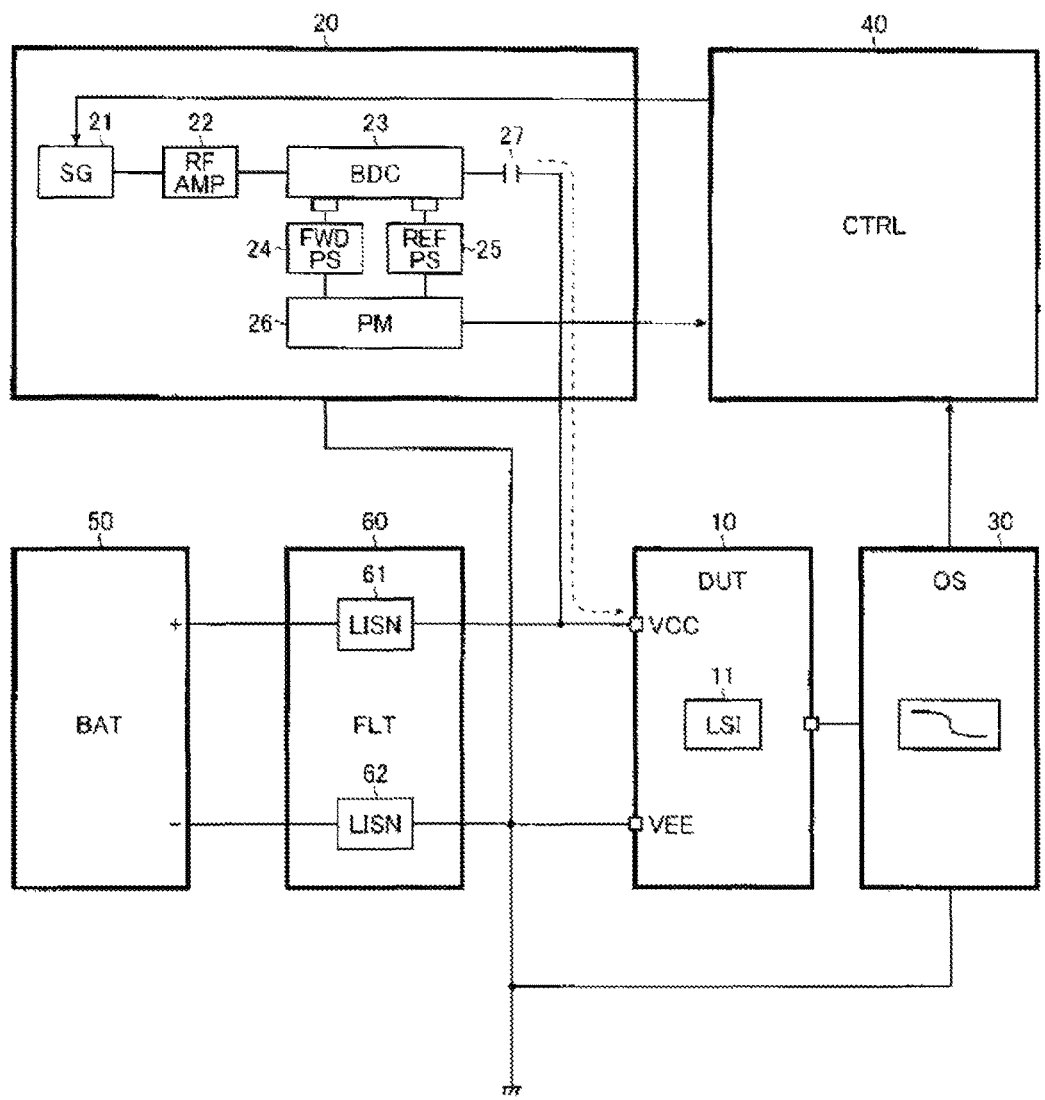
FIG. 1 is a block diagram showing a first exemplary configuration for a DPI test.

FIG. 1 is a block diagram showing a first exemplary configuration for a DPI test. The DPI test is one of Electro Magnetic Susceptibility (EMS) verification methods (IEC62132-4) for semiconductor integrated circuits, which have been standardized by International Electrotechnical Commission (IEC), and is carried out using a Device under Test (DUT) 10, a noise source unit 20, a detection unit 30, a controller 40, a battery 50, a power supply filter 60 and so on.

The DUT 10 includes a target electric circuit 11 (hereinafter, referred to as a LSI 11) and a PCB (Printed Circuit Board) on which the LSI 11 is mounted. It is of course that the DUT 10 may include only the LSI 11 as a stand-alone component. The DUT 10 does not necessarily need to be a practical device, but may be, in general, a simulation device for test.

In particular, if different LSIs are compared to one another (for example, if new models of LSIs are compared to old models of LSIs or if LSIs owned by our company are compared to those of other companies), it is preferable to use simulators having components of same features (for example, PCB size and its wiring patterns, kinds and characteristics of discrete parts mounted on the PCB, etc.) other than LSIs to be evaluated.

The noise source unit 20 is configured to inject a high-frequency noise signal (interference wave power) into a terminal of the DUT 10 (illustrated with a power supply terminal VCC in FIG. 1) and includes a signal generator 21, a RF amplifier 22, a bi-directional coupler 23, a forward wave side power sensor 24, a reflected wave side power sensor 25, a power meter 26 and a coupling capacitor 27.

The signal generator (SG) 21 generates a sinusoidal high-frequency noise signal. Oscillation frequency and amplitude of the high-frequency noise signal may be controlled by the controller 40. If an interference wave is a pulse, a pulse generator (PG) may be employed. If the interference wave is an impulse, an impulse generator (IG) may be employed.

The Radio Frequency (RF) amplifier 22 amplifies the high-frequency noise signal generated by the signal generator 21 with a predetermined gain.

The bi-directional coupler (BDC) 23 separates the high-frequency noise signal amplified by the RF amplifier 22 into a forward wave component directing to the DUT 10 and a reflected wave component returning from the DUT 10.

The forward wave side power sensor 24 measures power of the forward wave component obtained by the bi-directional coupler 23, whereas the reflected wave side power sensor 25 measures power of the reflected wave component obtained by the bi-directional coupler 23. Transmission lines of the forward wave side power sensor 24 and the reflected wave side power sensor 25 may be preferably put under a pseudo-blocking state (for example, impedance: 50Ω or more, power pass characteristic: −20 dBm or less).

The power meter 26 sends the forward wave power measured by the forward wave side power sensor 24 and the reflected wave power measured by the reflected wave side power sensor 25 to the controller 40. The controller 40 may calculate power actually injected into the DUT 10 through a differential calculation and may store a result of the differential calculation. As such, the power injected into the DUT 10 is measured in the power meter 26 that is remotely separated from the DUT 10. Accordingly, in order to measure the power injected into the DUT 10 with fine precision, it is preferable to decrease a cable loss in the high-frequency noise signal transmission to a minimum value (for example, 1 dB or less).

The coupling capacitor 27 is connected between the DUT 10 and an output of the bi-directional coupler 23 and passes only an AC component (high-frequency noise signal) while cutting a DC component. Although the coupling capacitor 27 is shown as one element of the noise source unit 20 in FIG. 1, a ceramic capacitor disposed on the PCB on which the LSI 11 is mounted may be used instead.

The detection unit 30 monitors an output waveform of the DUT 10 and sends a monitoring result to the controller 40. An oscilloscope or the like may be suitably used as the detection unit 30. In addition, in order to avoid any effect of the detection unit 30 on the DPI test, it is preferable to use a differential probe having high input impedance (1 MΩ) to put a transmission line from the DUT 10 to the detection unit 30 under a pseudo-blocking state.

The controller 40 is configured to generally control the DPI test. When the DPI test is performed, the controller 40 controls the signal generator 21, for example, to slowly increase the amplitude of the high-frequency noise signal (injected power) injected into the DUT 10 while fixing an oscillation frequency of the high-frequency noise signal. In addition, in parallel to the amplitude control, the controller 40 determines whether the LSI 11 is malfunctioning (determination on whether there are omission of pulses of a clock signal, frequency disturbance, non-standardized output voltage, or communication errors) based on the monitoring result of the detection unit 30. In addition, the controller 40 acquires the result of the calculation on measurements by the power meter 26 (the power injected into the DUT 10) at the time point of malfunction occurrence of the LSI 11 and stores the acquired calculation result in association with the oscillation frequency that has been set at that time. Then, the controller 40 obtains malfunction power frequency characteristics associated with each oscillation frequency of the high-frequency noise signal and the corresponding injected power in the malfunction occurrence by repeating the above-described measurement while sweeping the oscillation frequencies of the high-frequency noise signal. A personal computer capable of sequentially performing the above-described measurement may be suitably used as the controller 40.

The battery 50 is a DC power supply for supplying power to the DUT 10. For example, if the LSI 11 for a vehicle is evaluated in the DPI test, a battery for the vehicle may be used as the battery 50. However, it is noted that the DC power supply for the DUT 10 may include, for example, an AC/DC converter for generating a desired DC power from a commercial AC power, in addition to the battery.

The power supply filter 60 is a circuit unit for putting a transmission line from the noise source unit 20 to the battery 50 under a pseudo-blocking state and includes line impedance stabilization networks (LISNs) 61 and 62. Both the LISNs 61 and 62 stabilize apparent impedance of the battery 50. The LISN 61 is inserted in a power line connecting the positive electrode terminal (+) of the battery 50 and the power supply terminal VCC of the DUT 10 and the LISN 62 is inserted in a GND line connecting the negative electrode terminal (−) of the battery 50 and the GND terminal VEE of the DUT 10.

<DPI Test Result (Malfunction Power Frequency Characteristics)>

Figure 2:
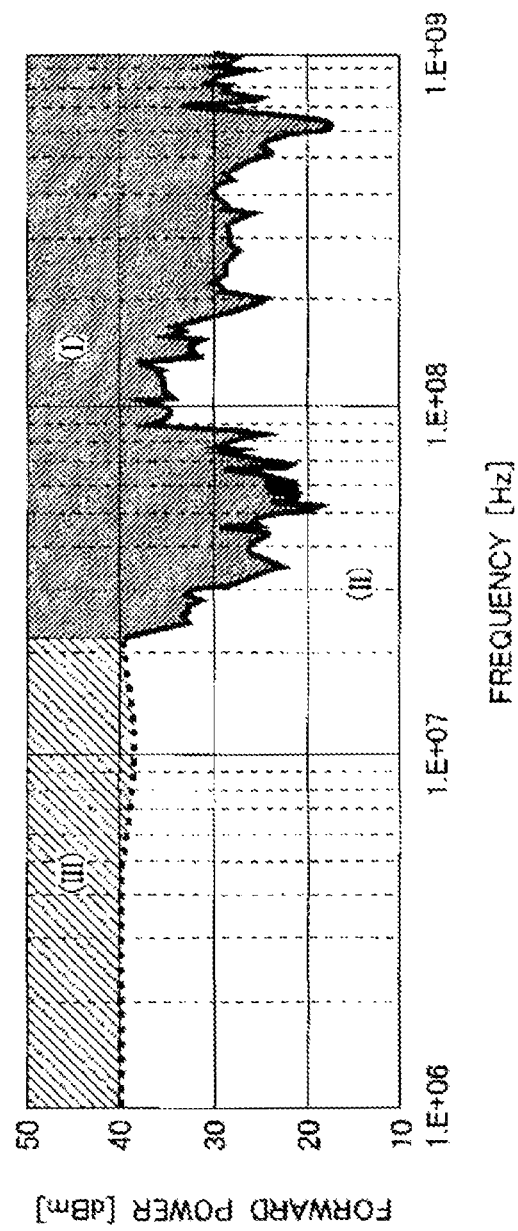
FIG. 2 is a view showing one example of a DPI test result (malfunction power frequency characteristics).

FIG. 2 is a view showing one example of a DPI test result (malfunction power frequency characteristics). In FIG. 2, a horizontal axis represents an oscillation frequency [Hz] of a high-frequency noise signal and a vertical axis represents injected power [dBm] of the high-frequency noise signal. In this figure, for each oscillation frequency of the high-frequency noise signal, a threshold injected power causing malfunction of the LSI 11 is plotted as a result of the DPI test (see a solid line in the figure). That is, the solid line in the figure corresponds to a malfunction boundary. A region (I) above this boundary corresponds to a malfunction region and a region (II) below the boundary corresponds to a normal operation region.

However, at an oscillation frequency at which no malfunction is caused even when a maximum power (for example, 38 to 40 dBm) is injected, the maximum power is potentially plotted (see a dashed line in the figure). That is, in the figure, the dashed line corresponds to a normal operation assurance boundary, a region (III) above this boundary corresponds to an out-assurance region, and a region (II) below the boundary corresponds to a normal operation region.

As such, in the DPI test, malfunction power frequency characteristics, which indicate magnitudes of a threshold high-frequency noise signal causing malfunction of the DUT 10 as the power injected into the DUT 10, are obtained. However, as described above in the Background section, even though the malfunction power frequency characteristics may be easily acquired, it is not easy to practically use those characteristics to improve problems occurring in the actual LSI 11.

Therefore, the present disclosure suggests an electric circuit evaluation method using a DPI test, including, in addition to a step of obtaining the malfunction power frequency characteristics, a step of obtaining, from the above-described malfunction power frequency characteristics, malfunction current frequency characteristics indicating a magnitudes of a threshold high-frequency noise signal causing malfunction of the LSI 11 as terminal currents I_LSI flowing at a certain portion of the LSI 11, and malfunction voltage frequency characteristics indicating a magnitude of a threshold high-frequency noise signal causing malfunction of the LSI 11 as a terminal voltage V_LSI applied between certain points of the LSI 11.

In this evaluation method, Scattering (S) parameters of the DUT 10 and the LSI 11 are measured to implement an equivalent circuit of the LSI 11 and perform its AC analysis, and Immunity Behavior (IB) modeling (acquiring the malfunction current frequency characteristics and the malfunction voltage frequency characteristics) of the terminal currents I_LSI and the terminal voltage V_LSI is performed based on results of the AC analysis. Each elementary step will be described in detail below.

<S Parameter Measurement>

Figure 3:
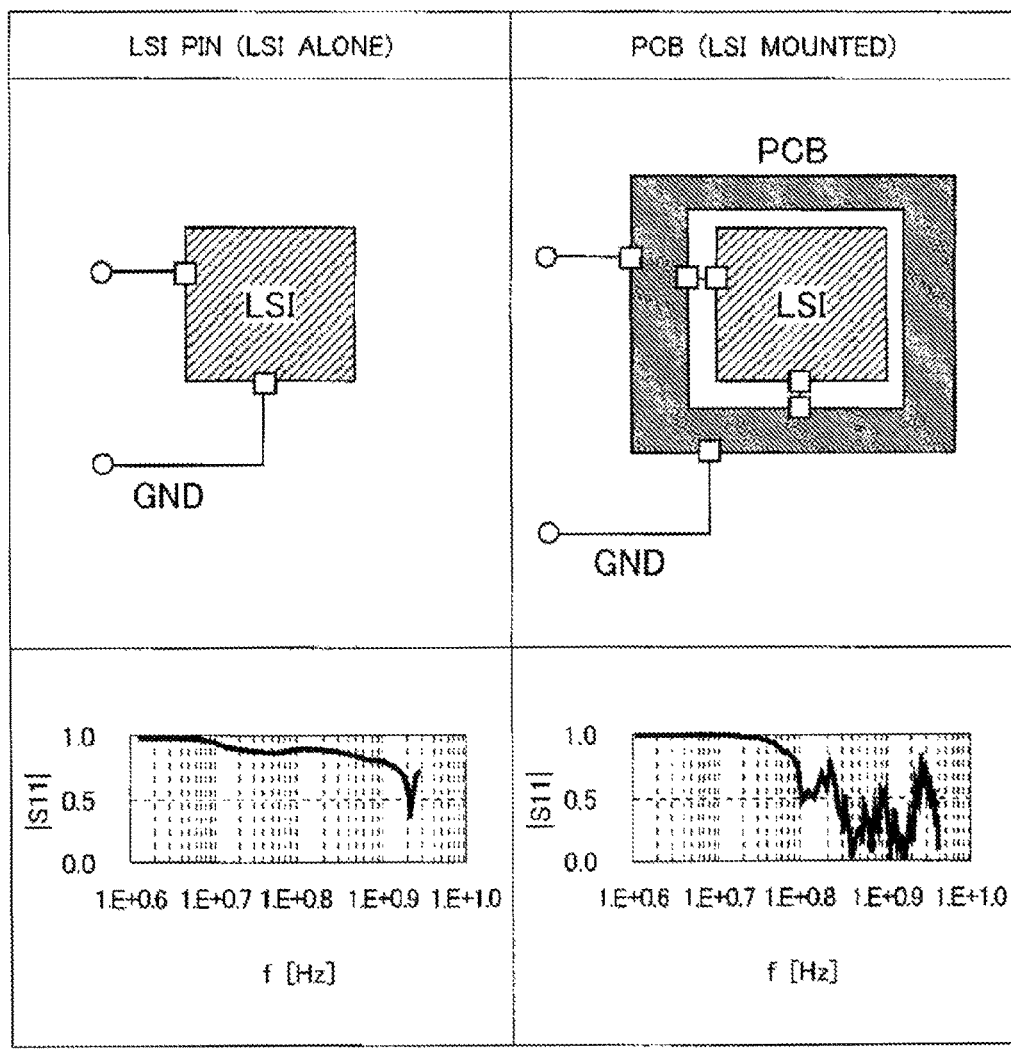
FIG. 3 is a view showing one example of S parameter measurement.

FIG. 3 is a view showing one example of S parameter measurement. The S parameter is a parameter indicating frequency characteristics of the DUT 10 and the LSI 11 and represents power pass characteristics or power reflection characteristics of a circuitry. For example, when a signal is input from a first port of a two-port pair circuitry (four-port circuitry), a percentage (reflection loss) of the signal reflected at the first port is illustrated as an S parameter |S11| in FIG. 3. In the two-port pair circuitry, in addition to the reflection loss (|S11|) of the first port, an insertion loss (|S21|) from the first port to a second port, an insertion loss (|S12|) from the second port to the first port and a reflection loss (|S22|) of the second port are also measured. A single S parameter may be measured for the LSI 11 and the S parameters may be measured for the DUT 10 when LSIs are mounted thereon.

<Implementation of Equivalent Circuit>

Figure 4:
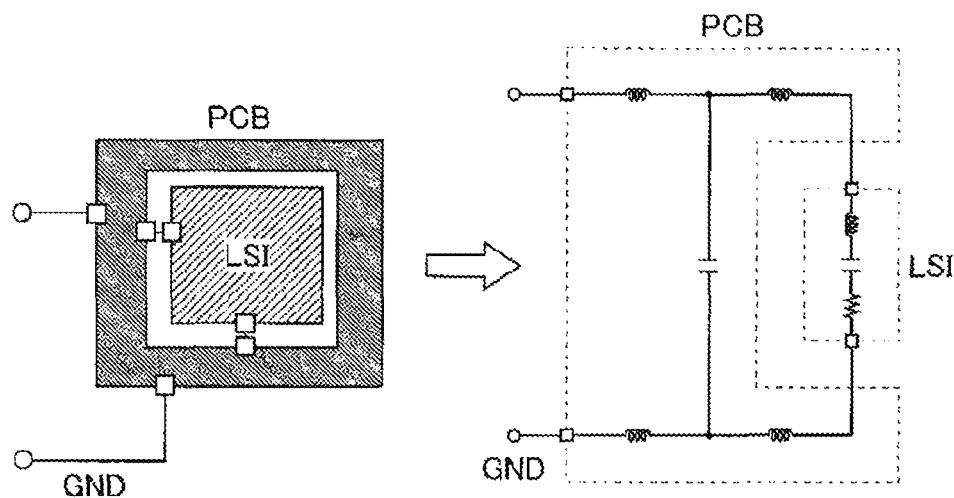
FIG. 4 is a view showing one example of implementation of an equivalent circuit.

FIG. 4 is a view showing one example of implementation of an equivalent circuit. An equivalent circuit for the LSI 11 and the PCB on which the LSI 11 is mounted may be implemented from the S parameters of the DUT 10 and the LSI 11. In the implementation of the equivalent circuit, for example, as shown in this figure, the LSI 11 may be regarded as a series circuit of a resistor R, a capacitor C and an inductor L and the PCB may be represented by an inductor L having wiring patterns and mounted parts (such as a capacitor C) on the PCB.

<AC Analysis>

Figure 5:
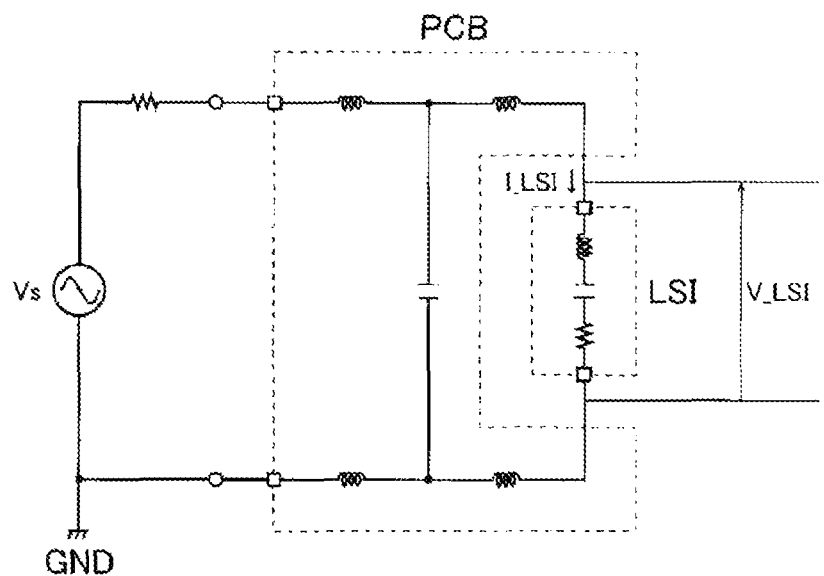
FIG. 5 is a view showing one example of an AC analysis.

FIG. 5 is a view showing one example of an AC analysis. The AC analysis for the equivalent circuit for the LSI 11 and the PCB on which the LSI 11 is mounted is performed. A 50Ω-series AC voltage source may be used as an AC signal source for generating an AC voltage Vs [Vrms]. In this case, a terminal current I_LSI flowing through a certain portion of the LSI 11 and a terminal voltage V_LSI applied between certain points of the LSI 11 can be expressed by functions of AC voltage Vs, as indicated by the following equations (1a) and (1b), respectively.

$$I\_LSI = fI(Vs) \tag{1a}$$

$$V\_LSI = fV(Vs) \tag{1b}$$

In addition, the following equation (2) is established between the AC voltage Vs generated in the AC signal source and the power Pi injected into the LSI 11.

$$Pi = Vs^2/200 \tag{2}$$

Accordingly, if Equation (2) is substituted into Equations (1a) and (1b), the terminal current I_LSI and the terminal voltage V_LSI can be expressed by functions of injected power Pi, as indicated by the following equations (3a) and (3b), respectively.

$$I\_LSI = fI(Vs) = fI(\sqrt{(Pi \times 200)}) = gI(Pi) \tag{3a}$$

$$V\_LSI = fV(Vs) = fV(\sqrt{(Pi \times 200)}) = gV(Pi) \tag{3b}$$

Examples of the certain portions through which the terminal current I_LSI flows may include a signal input terminal, a signal output terminal, a signal input/output terminal, a power supply terminal, a GND terminal and a heat radiating fin plate of the LSI 11. In particular, when the high-frequency noise signal is input to the signal input terminal of the LSI 11, the LSI 11 may be likely to malfunction. Therefore, it is very important to find malfunction current frequency characteristics or malfunction voltage frequency characteristics of the signal input terminal.

<IB Modeling (Malfunction Current/Voltage Frequency Characteristics)>

Figure 6:
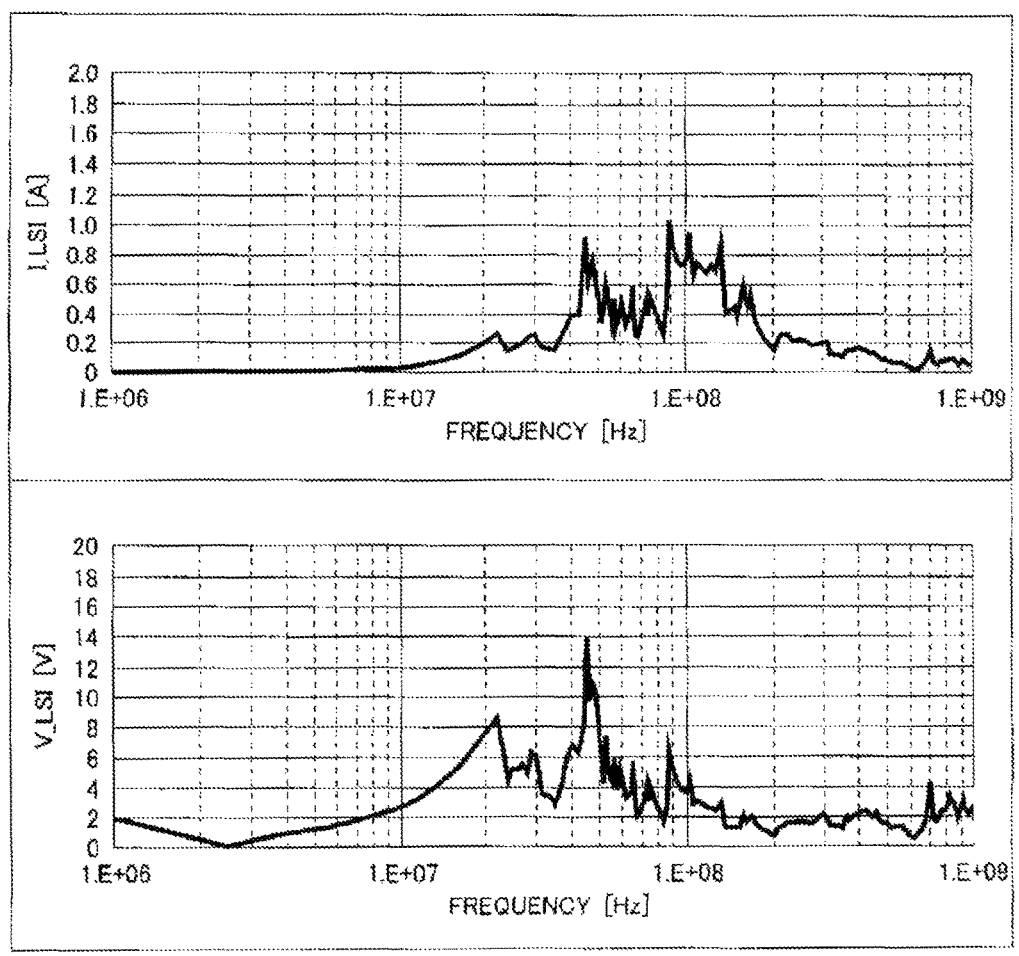
FIG. 6 is a view showing one example of malfunction current/voltage frequency characteristics.

FIG. 6 is a view showing one example of malfunction current frequency characteristics or malfunction voltage frequency characteristics. If the DPI test result (the threshold injected power Pi at which the LSI 11 malfunction occurs) is substituted into Equations (3a) and (3b), a threshold terminal current I_LSI and a threshold terminal voltage V_LSI at which the LSI 11 malfunction occurs can be obtained for each oscillation frequency of the high-frequency noise signal.

As such, in the electric circuit evaluating method according to the present disclosure, the malfunction current frequency characteristics and the malfunction voltage frequency characteristics are frequency characteristics for the LSI 11, which are extracted from the malfunction power frequency characteristics for the DUT 10. In this case, the malfunction current frequency characteristics and the malfunction voltage frequency characteristics may be extracted based on the malfunction power frequency characteristics of the DUT 10, the equivalent circuit of the DUT 10 and the equivalent circuit of the LSI 11.

Data related to the malfunction current frequency characteristics and the malfunction voltage frequency characteristics may be provided to a user, along with the LSI 11. With such data provided, the user may be allowed to avoid the malfunction of the LSI 11 more easily.

<Comparison with Arriving Current/Voltage Frequency Characteristics>

Figure 7:
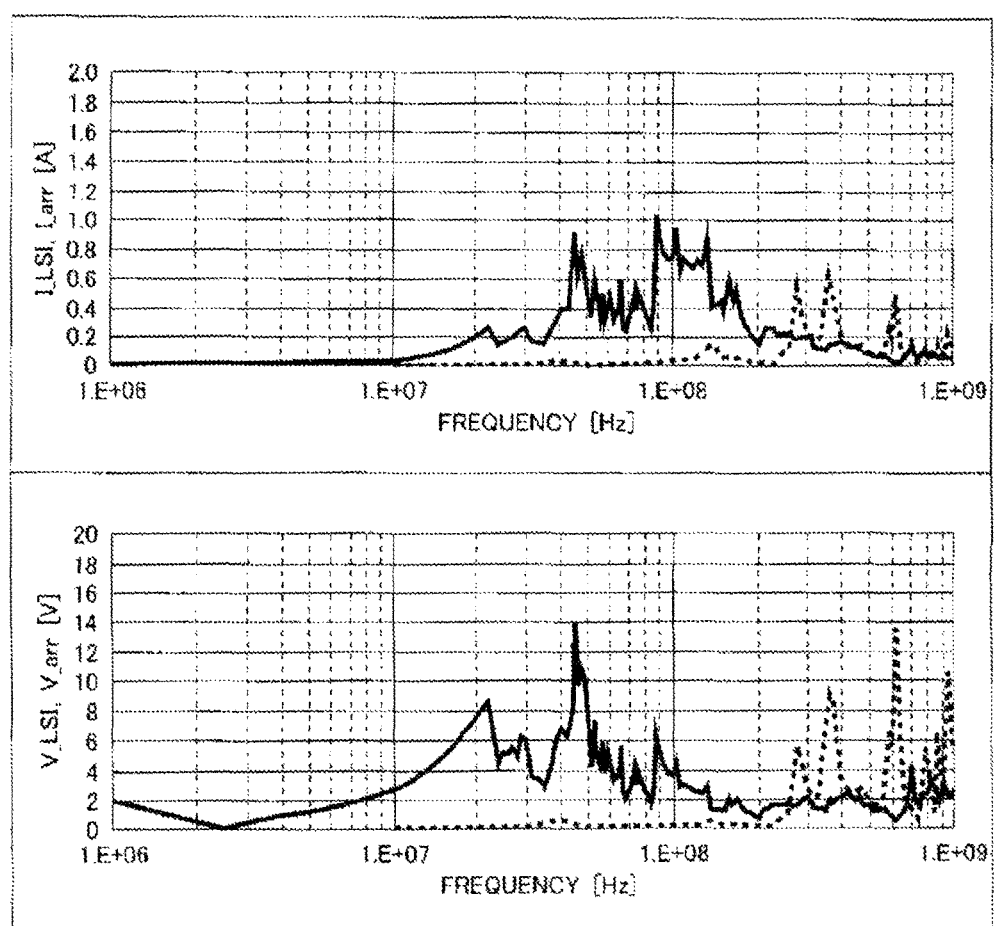
FIG. 7 is a view showing exemplary comparisons of arriving current frequency characteristics and arriving voltage frequency characteristics.

FIG. 7 is a view showing exemplary comparisons of the malfunction current frequency characteristics/malfunction voltage frequency characteristics shown in FIG. 6 (indicated by a solid line) and arriving current frequency characteristics/arriving voltage frequency characteristics (indicated by a dashed line). The arriving current frequency characteristics indicate frequency characteristics of an arriving current I_arr which arrives at and flows through a certain portion of the LSI 11 when a measurement object circuit unit or a simulation unit including the LSI 11 is subjected to an immunity test (details of which will be described later). The arriving voltage frequency characteristics indicate frequency characteristics of an arriving voltage V_arr which arrives and is applied between certain points of the LSI 11 in the immunity test.

Thus, according to the electric circuit evaluating method of the present disclosure, in order to utilize the pre-obtained malfunction current frequency characteristics/malfunction voltage frequency characteristics of the LSI 11 for an EMS evaluation, each of them may be compared with the arriving current frequency characteristics and the arriving voltage frequency characteristics of the LSI 11. With this comparison, for example, it may be determined that the LSI 11 may malfunction at an oscillation frequency at which the dashed line is above the solid line in FIG. 7. In addition, by performing the above comparison for each terminal of the LSI 11, a terminal which is causing malfunction of the LSI 11 may be specified, thereby enabling quick improvement of circuit design.

As can be understood from the above description, as long as the same LSI 11 is used, even when a structure of the PCB and a noise injection method (test method) are changed, it can predict whether the LSI 11 will malfunction or not by calculating the terminal current I_LSI and the terminal voltage V_LSI.

In addition, the arriving current frequency characteristics/arriving voltage frequency characteristics of the LSI 11 may be obtained through a simulation based on an equivalent circuit of the measurement object circuit unit including the LSI 11 or an equivalent circuit of the simulation unit including the LSI 11. This simulation requires performing an immunity test for the measurement object circuit unit or the simulation unit.

For example, if a LSI for a vehicle is evaluated, the immunity test may be a test based on ISO11452. Examples of the ISO11452-based test may include a radiation immunity test based on ISO11452-2, a transverse electromagnetic cell (TEMCELL) test based on ISO11452-3, and a bulk current injection (BCI) test based on ISO1145204. The immunity test may be also tests based on an immunity test of products represented by ISO7637 and IEC 61000-4 series. As one example, the BCI test will be described in detail below.

<BCI Test>

Figure 8:
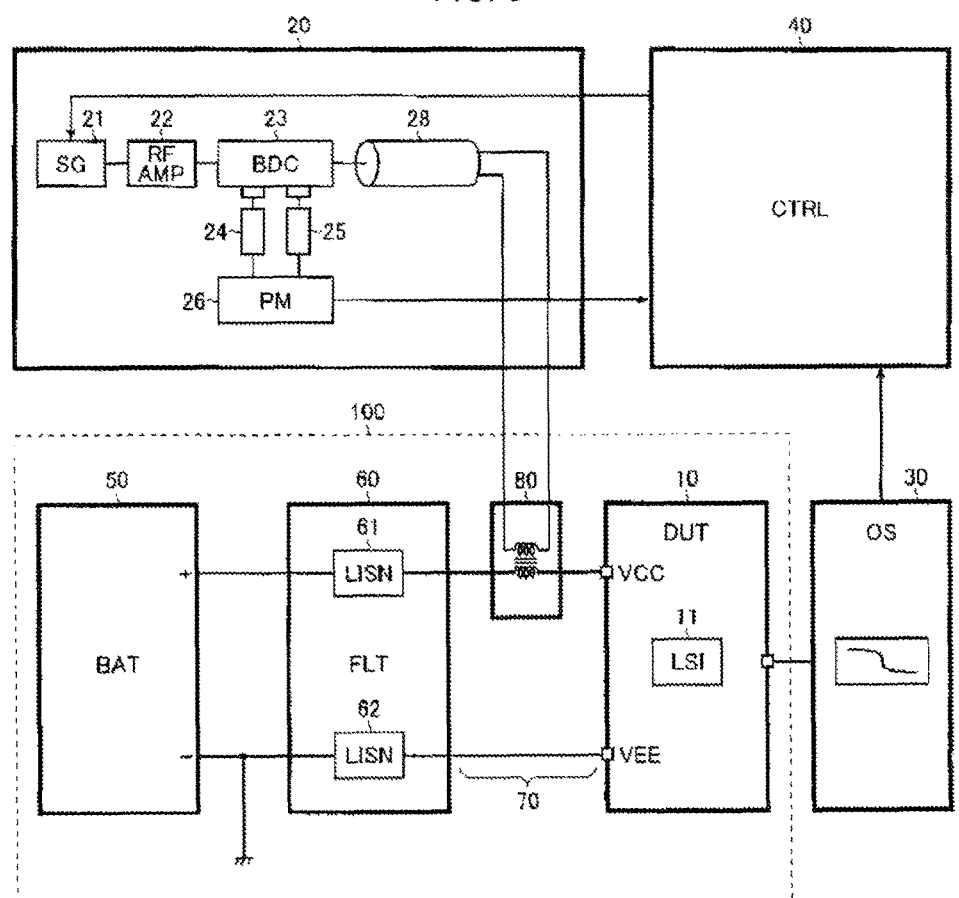
FIG. 8 is a block diagram showing one exemplary configuration of a BCI test.

FIG. 8 is a block diagram showing one exemplary configuration of the BCI test. The BCI test is one of component tests for electrical interference by narrowband electromagnetic radiation energy for electronic vehicle products standardized by ISO (International Organization for Standardization) (EMS standard for products: ISO11452-4).

The BCI test is a test performed for a measurement object circuit unit (or simulation unit) 100 including the LSI 11 and is carried out using a DUT 10, a noise source unit 20, a detection unit 30, a controller 40, a battery 50, and a power supply filter 60, as the DPI test described above (see FIG. 1).

The measurement object circuit unit 100 corresponds to an actual product (device) on which the LSI 11 mounted, and includes the DUT 10, the battery 50, and wire harness 70 having a length of 1.5 to 2.0 m which makes electric connection between the DUT 10 and the power supply filter 60. In addition, an injection probe 80 is inserted in the wire harness 70 to which a bulk current is injected through a 50Ω transmission line 28 of the noise source unit 20.

When the measurement object circuit unit 100 is subjected to the BCI test, the arriving current frequency characteristics/arriving voltage frequency characteristics of the LSI 11 can be obtained through a simulation based on an equivalent circuit of the measurement object circuit unit 100.

When the simulation unit, which is a simplified version of the measurement object circuit unit 100, is subjected to the BCI test, the arriving current frequency characteristics/arriving voltage frequency characteristics of the LSI 11 can be obtained through a simulation based on the equivalent circuit of the measurement object circuit unit 100 and an equivalent circuit of the simulation unit.

The equivalent circuits may be obtained based on S parameters of the measurement object circuit unit 100 and S parameters of the LSI 11.

Thus, according to the electric circuit evaluating method of the present disclosure, when the measurement object circuit unit 100 including the LSI 11 is subjected to an immunity test (for example, the BCI test), the arriving current frequency characteristics indicating the arriving current I_arr which arrives at and flows through a certain portion of the LSI 11 may be obtained through a simulation based on the equivalent circuit of the LSI 11 and the equivalent circuit of the measurement object circuit unit 100. When the same immunity test is performed, the arriving voltage frequency characteristics indicating the arriving voltage V_arr which arrives and is applied between certain points of the LSI 11 may be obtained through a simulation based on the equivalent circuit of the LSI 11 and the equivalent circuit of the measurement object circuit unit 100.

<DPI Test (Second Exemplary Configuration)>

Figure 9:
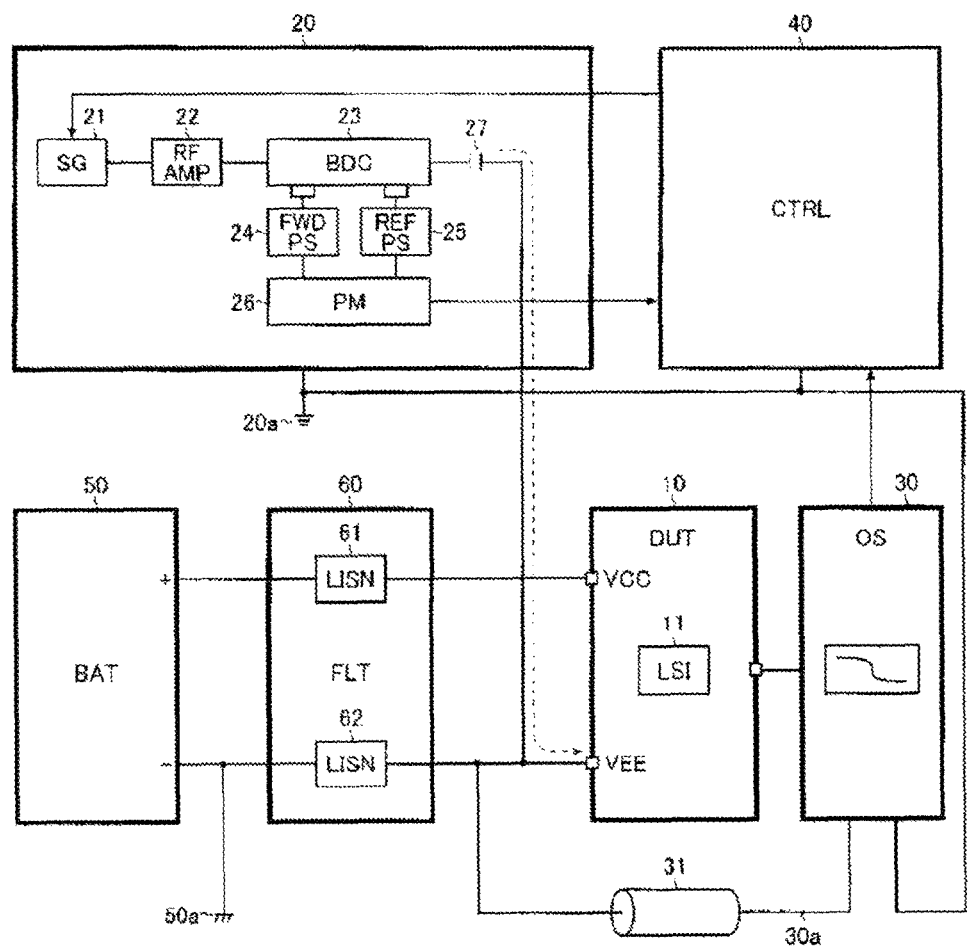
FIG. 9 is a block diagram showing a second exemplary configuration of the DPI test.

FIG. 9 is a block diagram showing a second exemplary configuration for the DPI test. The second exemplary configuration is basically the same as the first exemplary configuration, except that the high-frequency noise signal is input to the ground terminal VEE of the DUT 10, instead of inputting it to a terminal of the DUT 10 on a ground reference, to obtain frequency characteristics of magnitude of power that causes malfunctioning of the LSI 11 (malfunction power frequency characteristics). Therefore, the same or similar elements as the first exemplary configuration are denoted by the same reference numerals as FIG. 1 and explanation of which will not be repeated. The following description will be focused on specific features of the second exemplary configuration.

The first feature of the second exemplary configuration for the DPI test is that a detection reference ground 30a of the detection unit 30 for predicting whether the LSI 11 will malfunction is connected to the ground terminal VEE of the DUT 10 with a high impedance part 31. The high impedance part 31 may be formed with a resistor (for example, 10 kΩ), a coil, a ferrite bead etc.

When the high-frequency noise signal is injected into the ground terminal VEE of the DUT 10, if the detection reference ground 30a has low-impedance connection to the ground terminal VEE of the DUT 10 in order to obtain a reference potential of the detection unit 30, the high-frequency noise signal is dispersed to the ground of the detection unit 30. As a result, the detection unit 30 affects the DPI test result. On the other hand, if the ground of the detection unit 30 is completely insulated from the ground terminal VEE of the DUT 10, the ground potential of the DUT 10 may be different from the ground potential of the detection unit 30, which may result in difficulty in correctly detecting an output waveform.

Therefore, to solve this problem, the detection reference ground of the detection unit 30 and the ground terminal VEE of the DUT 10 are connected with the high impedance part 31 (pseudo-blocking state), which can reduce the amount of leakage for the high-frequency noise signal to the detection unit 30.

The second feature of the second exemplary configuration for the DPI test is that a DC component is blocked from a ground 20a of the noise source unit 20 to input the high-frequency noise signal for malfunction test to the ground VEE of the DUT 10. That is, the ground 20a becomes a separate node from the ground VEE. This configuration can prevent the high-frequency noise signal of the noise source unit 20 to the ground VEE from leaking.

The third feature of the second exemplary configuration for the DPI test is that the ground 20*a* of the noise source unit 20 to input the high-frequency noise signal for malfunction test to the DUT 10 becomes a separate node and is blocked from a ground 50*a* of a DC power supply such as the battery 50 to supply power to the DUT 10.

As shown in FIG. 9, the ground 20*a* of the noise source unit 20 serves as a common ground and is placed in the common potential with the system ground of the controller 40 and the detection unit 30.

Data related to the malfunction power frequency characteristics may be provided to a user, along with the LSI 11. With such data provided, the user may be allowed to utilize the data to prevent the LSI 11 from malfunctioning.

Figure 10:
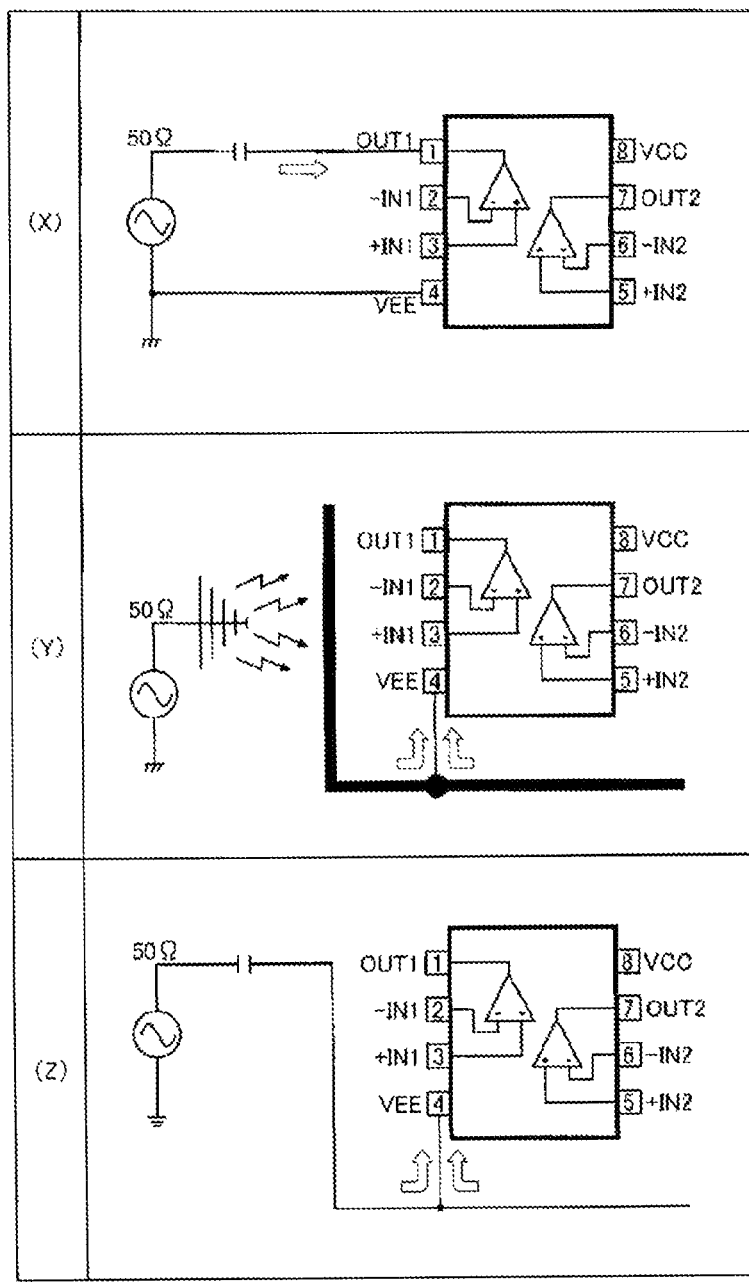
FIG. 10 is a schematic view used for comparing the second exemplary configuration of FIG. 9 and other exemplary configurations.

FIG. 10 is a schematic view used for comparing the second exemplary configuration of FIG. 9 and other exemplary configurations. Section (X) shows a configuration that a high-frequency noise signal is injected into an output terminal OUT1 of a LSI on a ground reference, as the first exemplary configuration. Section (Y) shows a configuration that a high-frequency noise signal is injected into a ground terminal VEE of a LSI by emitting an interference electromagnetic wave from an antenna to a chassis. Section (Z) shows a configuration that a high-frequency noise signal is injected into a ground terminal VEE of a LSI, as the second exemplary configuration.

The configuration shown in section (X) can only evaluate malfunctions occurring when the high-frequency noise signal is injected into terminals other than the ground terminal VEE of the LSI.

The configuration shown in section (Y) can evaluate malfunctions occurring when the high-frequency noise signal is injected into the ground terminal VEE of the LSI. However, with this configuration, the existence of the chassis will affect the DPI test result.

The configuration shown in section (Z) can evaluate malfunctions occurring when the high-frequency noise signal is injected into the ground terminal VEE of the LSI, without being affected by the chassis.

<DPI Test (Third Exemplary Configuration)>

Figure 11:
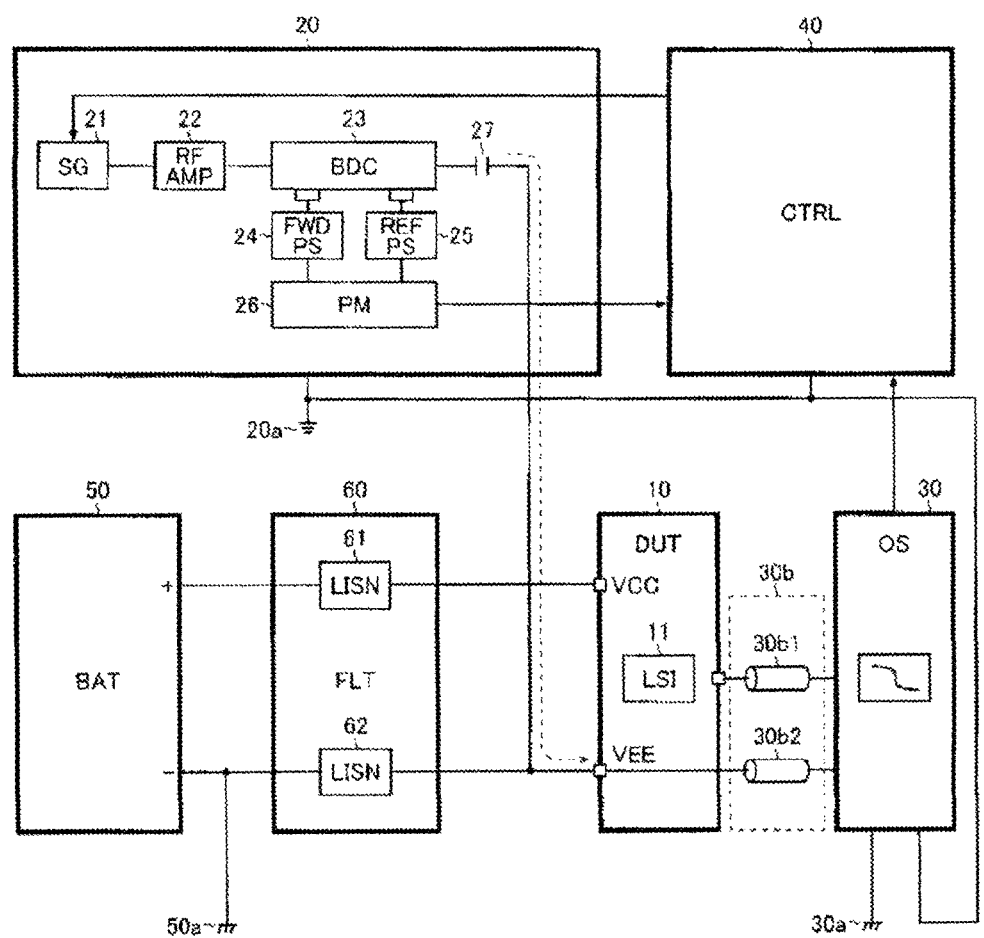
FIG. 11 is a schematic view showing a third exemplary configuration for the DPI test.

FIG. 11 is a block diagram showing a third exemplary configuration for the DPI test. The third exemplary configuration is similar to the second exemplary configuration in that the high-frequency noise signal is input to the ground terminal VEE of the DUT 10 to obtain frequency characteristics of magnitude of power that cause malfunctioning of the LSI 11 (malfunction power frequency characteristics). Therefore, the same or similar elements as the second exemplary configuration are denoted by the same reference numerals as FIG. 9 and explanation of which will not be repeated. The following description will be focused on specific features of the third exemplary configuration.

In the third exemplary configuration for the DPI test, the detection unit 30 includes a high impedance (for example, 1 MΩ) differential input part 30*b* having a first differential input 30*b*1 and a second differential input 30*b*2. A detection object of the DUT 10 is connected to the first differential input 30*b*1 and the GND terminal VEE of the DUT 10 is connected to the second differential input 30*b*2. Thus, the connection from the DUT 10 to the detection unit 30 is in a pseudo-blocking state, thereby preventing the detection unit 30 from affecting on the DPI test. In addition, with regard to the detection unit 30 of the third exemplary configuration, since there is no need to match the ground potential of the DUT 10 with the detection reference ground potential of the detection unit 30, the ground of the detection unit 30 may be completely electrically isolated from the ground terminal VEE of the DUT 10 so that the detection reference ground 30*a* may be connected to an appropriate potential.

<DPI Test (Fourth Exemplary Configuration)>

Figure 12:
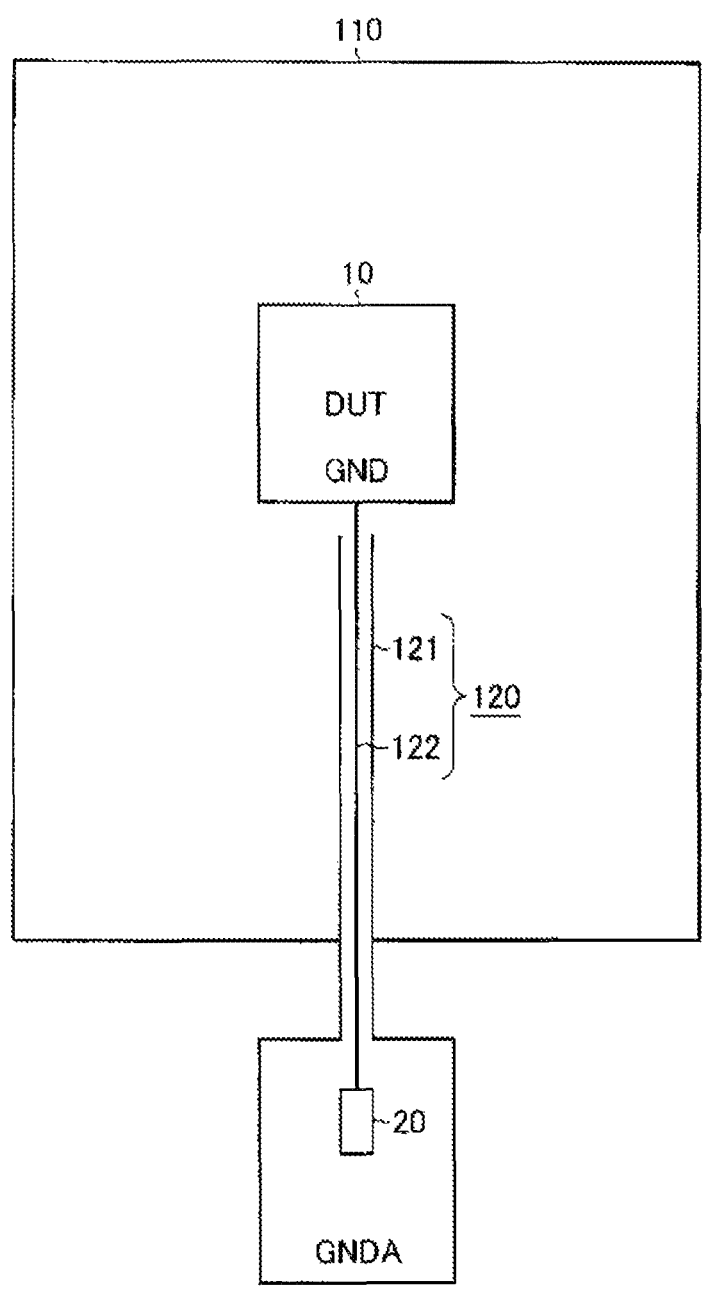
FIG. 12 is a schematic view showing a fourth exemplary configuration for the DPI test.

FIG. 12 is a schematic view showing a fourth exemplary configuration for the DPI test. The fourth exemplary configuration is basically the same as the first to third exemplary configurations, except that the DUT 10 is enclosed by a shield structure 110. Therefore, the same or similar elements as the first to third exemplary configurations are denoted by the same reference numerals as FIGS. 1, 9 and 11 and explanation of which will not be repeated. The following description will be focused on specific features of the fourth exemplary configuration.

In the fourth exemplary configuration for the DPI test, the DUT 10 is disposed within the shield structure 110. The shield structure 110 is a closed space made of a conductor, such as, for example, a shield room or a shield box commonly used as an electric field shield.

A high-frequency noise signal for a malfunction test is input from the noise source unit 20 to the DUT 10 via a coaxial cable 120. The DPI test of the fourth exemplary configuration is the same as the DPI tests of the first to third exemplary configurations in that the high-frequency noise signal is input to the DUT 10 to obtain frequency characteristics of magnitude of power that causes malfunctioning of the DUT 10.

Here, a ground of the shield structure 110 (shield room wall) and a ground GNDA of the noise source unit 20 are short-circuited to each other with high DC or AC (RF) conductivity. On the other hand, the ground GND of the DUT 10 and the ground GNDA of the shield structure 110 are blocked from each other.

Stating specifically with reference to the example of FIG. 12, the coaxial cable 120 extending from the noise source unit 20 to the DUT 10 passes through the shield structure 110, for example, via a through type N connector. An outer conductor (ground line) 121 of the coaxial cable 120 is shorted to the shield structure 110 and is blocked from the DUT 10. Thus, conditions for injecting the high-frequency noise signal into a terminal (particularly, the ground terminal) of the DUT 10 are met.

On the other hand, an inner conductor 122 of the coaxial cable 120 is a high-frequency noise signal transmission line connected to the DUT 10. Here, a wiring pattern (particularly, a GND pattern) of the PCB into which the high-frequency noise signal is injected acts as a radiating antenna.

As such, an evaluator for performing the DPI test of the fourth exemplary configuration includes the shield structure 110 for enclosing the DUT 10, the coaxial cable 120 passing through the shield structure 110, and the noise source unit 20 to input the high-frequency noise signal for malfunction test to the DUT 10 through the coaxial cable 120. The coaxial cable 120 includes the outer conductor 121 short-circuited to the shield structure 110 as well as blocked from the DUT 10 and the inner conductor 122 connected to the DUT 10 for input of the high-frequency noise signal to the DUT 10.

<Return Path of High-Frequency Noise Signal>

Figure 13:
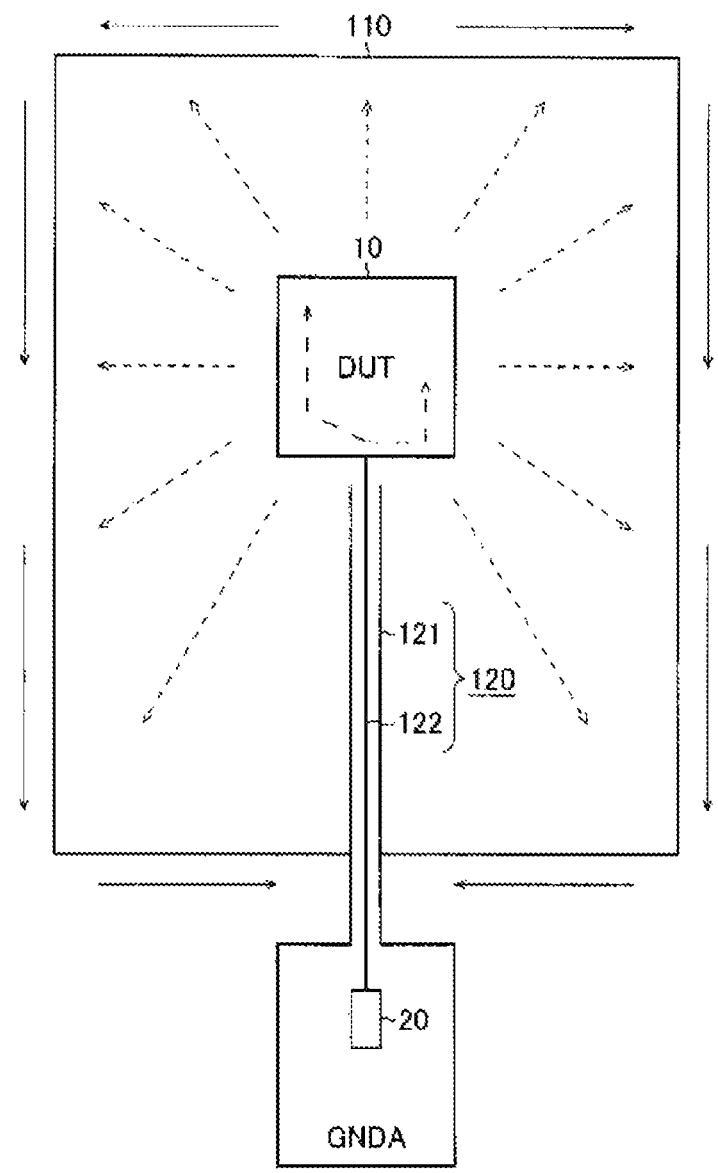
FIG. 13 is a schematic view showing a return path of a high-frequency noise signal.

FIG. 13 is a schematic view showing a return path of a high-frequency noise signal. A larger dashed arrow shown inside the DUT 10 indicates a noise propagation path through the DUT 10 via the easiest path from any terminal (a ground terminal in this example) into which the high-frequency noise signal is injected. Smaller dashed arrows directing from the DUT 10 to the shield structure 110 indicate a noise propagation path through radio waves. Solid arrows along the shield structure 110 indicate a conductive interference noise which returns to the noise source unit 20 via the shield structure 110.

The high-frequency noise signal injected into the ground of the DUT 10 returns to the noise source unit 20 via the easiest path depending on its oscillation frequency. Since the ground GND of the DUT 10 and the ground GNDA of the shield structure 110 are blocked from each other, these grounds are coupled to each other by the radio waves (see smaller dashed lines in the figure). A return path defined by the easiest path through the radio waves is an important factor for the DPI test of the third exemplary configuration.

For a DPI test performed with the DUT 10 not enclosed by the shield structure 110, a return path through which the radio waves emitted from the ground GND of the DUT 10 returns to the ground GNDA of the noise source unit 20 is vastly varied depending on test environments (for example, a structure of a building and propagation characteristics of the radio waves), which affects the test result. In contrast, for the DPI test performed with the DUT 10 enclosed by the shield structure 110, since the return path is fixed to the path through the shield structure 110, it is possible to obtain a test result that does not vary depending on the test environments and achieve a malfunction evaluation reflecting actual conditions of the DUT 10.

Data related to the malfunction power frequency characteristics may be provided to a user, along with the LSI 11. With such data provided, the user may be allowed to utilize the data to prevent the LSI 11 from malfunctioning.

<Attachments>

Figure 14:
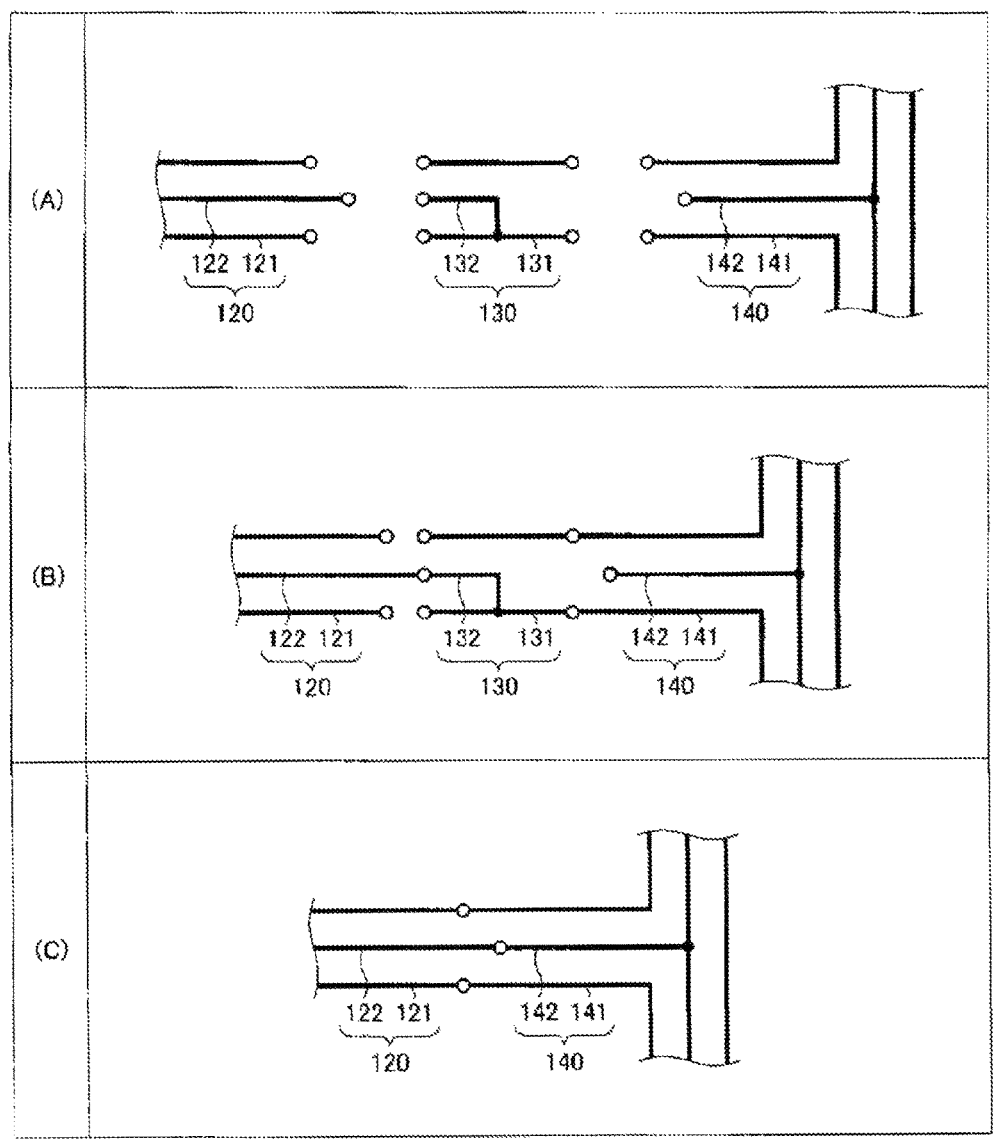
FIG. 14 is a schematic view showing one exemplary configuration for an attachment.

FIG. 14 is a schematic view showing one exemplary configuration for an attachment inserted between the DUT 10 and the coaxial cable 120. Section (A) indicates a state where the coaxial cable 120, an attachment 130 and a connector 140 installed in the side of the DUT 10 are separated from one another. Section (B) indicates a state where the attachment 130 is used to connect the coaxial cable 120 and the connector 140. Section (C) indicates a state where the coaxial cable 120 and the connector 140 are directly connected to each other without using the attachment 130.

The attachment 130 of this exemplary configuration includes an outer conductor 131 and an inner conductor 132. As shown in section (B), under the state where the attachment 130 is used to connect the coaxial cable 120 and the connector 140, the outer conductor 131 of the attachment 130 makes electrical conduction with an outer conductor 141 (GND) of the connector 140 while making no electrical conduction with the outer conductor 121 (GNDA) of the coaxial cable 120. The outer conductor 121 of the coaxial cable 120 and the outer conductor 131 of the attachment 130 may be separated from each other with a gap (4 mm) between opposing surfaces of a SMA [Sub Miniature type A] connector for flange fixation.

On the other hand, the inner conductor 132 of the attachment 130 has one end that is shorted to the outer conductor 131 and makes electrical conduction with the inner conductor 122 (noise line) of the coaxial cable 120 while making no electrical conduction with an inner conductor 142 (signal line) of the connector 140. The outer conductor 131 is an open stub of 24 mm from the short point with the inner conductor 132 to its open end.

With the usage of the above-configured attachment 130, the inner conductor 122 of the coaxial cable 120 can be very easily connected to the DUT 10, while blocking the outer conductor 121 of the coaxial cable 120 from the DUT 10.

In addition, as shown in section (C), when the coaxial cable 120 and the connector 140 are directly connected to each other without using the attachment 130, it is natural that the outer conductor 121 and the inner conductor 122 of the coaxial cable 120 be respectively connected to the outer conductor 141 and the inner conductor 142 of the connector 140.

<Evaluation Method of Entire Device Including a Plurality of Electrical Circuits>

Figure 15:
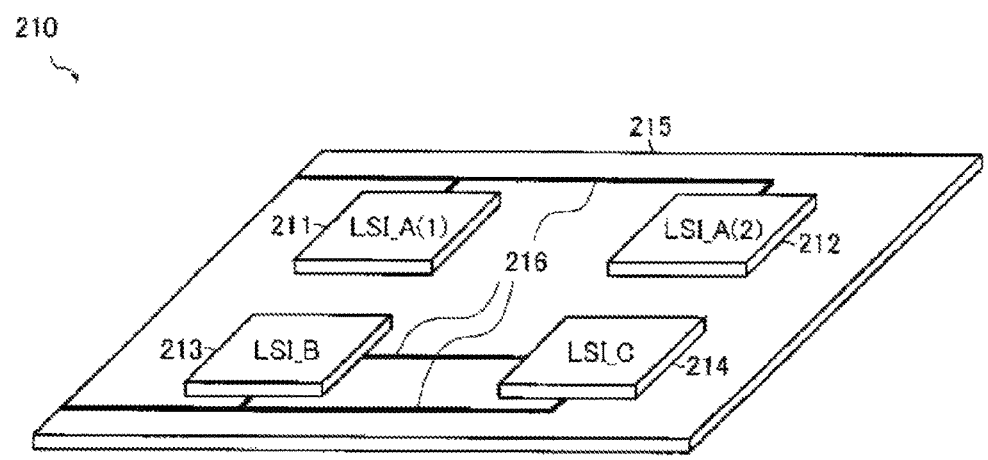
FIG. 15 is a schematic view showing one configuration example of a device including a plurality of electrical circuit.

FIG. 15 is a schematic view showing one configuration example of a device including a plurality of electrical circuits. A system board 210 of this configuration example is a device including a printed circuit board 215 on which a plurality of semiconductor integrated circuit devices 211 to 214 (hereinafter referred to as LSIs 211 to 214) are mounted. The LSIs 211 to 214 are connected to printed wirings 216 on the PCB 215.

The LSI 211 and the LSI 212 are of the same type and the LSI 213 and the LSI 214 are of different types from the LSIs 211 and 212. It is apparent that each of the LSIs 211 to 214 is mounted on a different position on the PCB 215.

In performing a malfunction evaluation for the entire system board 210, the entire system board 210 may be generally assumed as a device under test (DUT) subjected to a DPI test. However, this evaluation method is not always efficient since it is necessary to perform the DPI test again whenever the wiring layout of the system board 210 and the mounting positions of the LSIs 211 to 214 are changed.

Therefore, an electrical circuit evaluation method in which magnitudes of a threshold noise signal causing malfunction of the device including the plurality of electrical circuits can be obtained through simulation is suggested as below.

To begin with, in a first step, for each of the LSIs 211 to 214 mounted on the system board 210, first malfunction frequency characteristics indicating magnitudes of the threshold noise signal causing malfunction are obtained. The first malfunction frequency characteristics may be obtained from the DPI test result described above. That is, in the first step, for each of the LSIs 211 to 214, malfunction current frequency characteristics indicating the magnitudes of the threshold noise signal causing malfunction of the corresponding LSI as currents flowing into a certain portion of the LSI and malfunction voltage frequency characteristics indicating the magnitudes of the threshold noise signal causing malfunction of the corresponding LSI as voltages applied between certain points of the LSI may be obtained.

In a second step, second malfunction frequency characteristics indicating the magnitude of the threshold noise signal causing malfunction of the entire system board 210 are obtained based on the first malfunction frequency characteristics obtained for each of the LSI 211 to 214, an equivalent circuit of the entire system board 210 and an equivalent circuit of each of the LSIs 211 to 214.

The equivalent circuit of the entire system board 210 and the equivalent circuit of each of the LSIs 211 to 214 are respectively based on S parameters (see FIG. 3 described above).

According to this evaluation method, since the malfunction frequency characteristics of the system board 210 including the LSIs 211 to 214 can be obtained through a simulation, there is no need to perform the DPI test again whenever the wiring layout of the system board 210 and the mounting positions of the LSIs 211 to 214 are changed.

Although it has been illustrated in FIG. 15 that the plurality of electrical circuits are the LSIs 211 to 214 and the device including these circuits is the system board 210, without being limited thereto, the above-described evaluation method may be applied to any objects in a wider range of applications.

Figure 16:
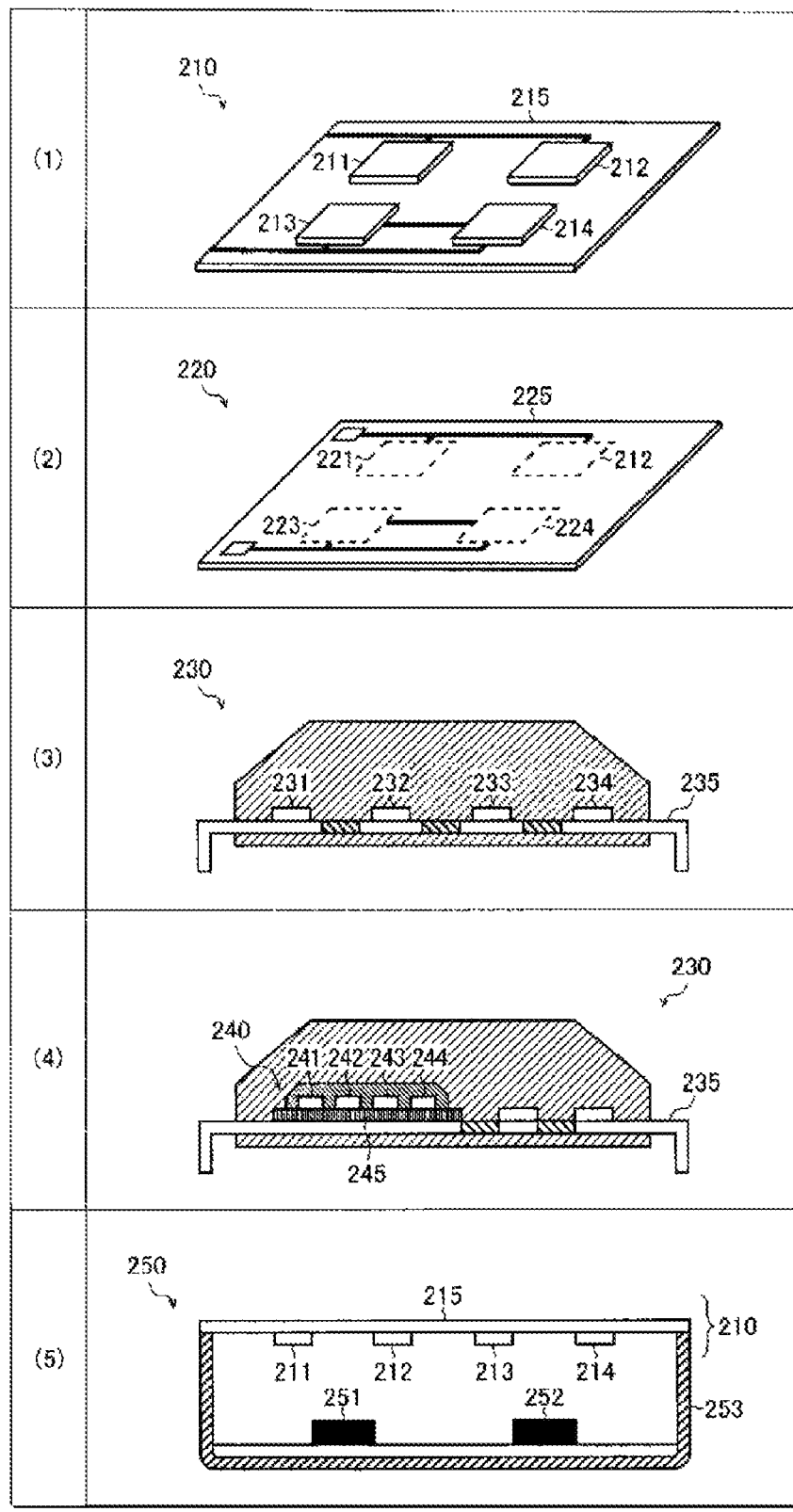
FIG. 16 is a schematic view showing various devices including a plurality of electrical circuits.

FIG. 16 is a schematic view showing various devices including a plurality of electrical circuits.

Section (1) of FIG. 16 shows a system board 210 including a PCB 215 on which LSIs 211 to 214 are mounted, as shown in FIG. 15. In this configuration example, the LSIs 211 to 214 correspond to the plurality of electrical circuits and the system board 210 corresponds to the device including the plurality of electrical circuits. In this configuration example, when performing a malfunction evaluation for the entire system board 210, for each of the LSIs 211 to 214 mounted on the system board 210, first malfunction frequency characteristics indicating the magnitudes of the threshold noise signal causing malfunction of the corresponding LSI are first obtained, and then, second malfunction frequency characteristics indicating the magnitudes of the threshold noise signal causing malfunction of the entire system board 210 are obtained based on the first malfunction frequency characteristics, an equivalent circuit of the entire system board 210 and an equivalent circuit of each of the LSIs 211 to 214.

Section (2) of FIG. 16 shows a bare chip 220 including a wafer 225 on which circuit blocks 221 to 224 are integrated. In this configuration example, the circuit blocks 221 to 224 correspond to the plurality of electrical circuits and the bare chip 220 corresponds to a device including the plurality of electrical circuits. In this configuration example, when performing a malfunction evaluation for the entire bare chip 220, for each of the circuit blocks 221 to 224 integrated in the bear chip 220, first malfunction frequency characteristics indicating the magnitudes of the threshold noise signal causing malfunction of the corresponding circuit block are first obtained, and then, second malfunction frequency characteristics indicating the magnitudes of the threshold noise signal causing malfunction of the entire bare chip 220 are obtained based on the first malfunction frequency characteristics, an equivalent circuit of the entire bare chip 220 and an equivalent circuit of each of the circuit blocks 221 to 224.

Section (3) of FIG. 16 shows a multi-chip type semiconductor integrated circuit device 230 (hereinafter referred to as LSI 230) including a lead frame 235 and bare chips 231 to 234 respectively mounted on different portions electrically isolated from one another on the lead frame 235. In this configuration example, the bare chips 231 to 234 correspond to the plurality of electrical circuits and the LSI 230 corresponds to the device including the plurality of electrical circuits. In this configuration example, when performing a malfunction evaluation for the entire LSI 230, for each of the bare chips 231 to 234 packaged in the LSI 230, first malfunction frequency characteristics indicating the magnitudes of the threshold noise signal causing malfunction of the corresponding bare chip are first obtained, and then, second malfunction frequency characteristics indicating the magnitudes of the threshold noise signal causing malfunction of the entire LSI 230 are obtained based on the first malfunction frequency characteristics, an equivalent circuit of the entire LSI 230 and an equivalent circuit of each of the bare chips 231 to 234.

Section (4) of FIG. 16 shows a multi-chip type module 240 including a module board 245 and bare chips 241 to 244 respectively mounted on different portions electrically isolated from one another on the module board 245. In this configuration example, the bare chips 241 to 244 correspond to the plurality of electrical circuits and the module 240 corresponds to the device including the plurality of electrical circuits. In addition, as one element of the LSI 230, the module 240 is mounted on the lead frame 235, along with other bare chips. In this configuration example, when performing a malfunction evaluation for the entire module 240, for each of the bare chips 241 to 244 incorporated in the module 240, first malfunction frequency characteristics indicating the magnitudes of the threshold noise signal causing malfunction of the corresponding bare chip are first obtained, and then, second malfunction frequency characteristics indicating the magnitudes of the threshold noise signal causing malfunction of the entire module 240 are obtained based on the first malfunction frequency characteristics, an equivalent circuit of the entire module 240 and an equivalent circuit of each of the bare chips 241 to 244.

Section (5) of FIG. 16 shows a power module 250 (for example, a power supply module) including the system board 210 of section (1), power elements 251 and 252 separated from the system board 210, and a case 253 sealing the system board 210 and the power elements 251 and 252. The power elements 251 and 252 are electrically isolated from each other and are mounted in the case 253. In this configuration example, the LSIs 211 to 214 correspond to the plurality of electrical circuits and the power module 250 corresponds to the device including the plurality of electrical circuits. In this configuration example, when performing a malfunction evaluation for the entire power module 250, for each of the LSIs 211 to 214 contained in the power module 250, first malfunction frequency characteristics indicating the magnitudes of the threshold noise signal causing malfunction of the corresponding LSI are first obtained, and then, second malfunction frequency characteristics indicating the magnitudes of the threshold noise signal causing malfunction of the entire power module 250 are obtained based on the first malfunction frequency characteristics, an equivalent circuit of the entire power module 250 and an equivalent circuit of each of the LSIs 211 to 214.

<Evaluation Method of Device Including Noise Source>

Figure 17:
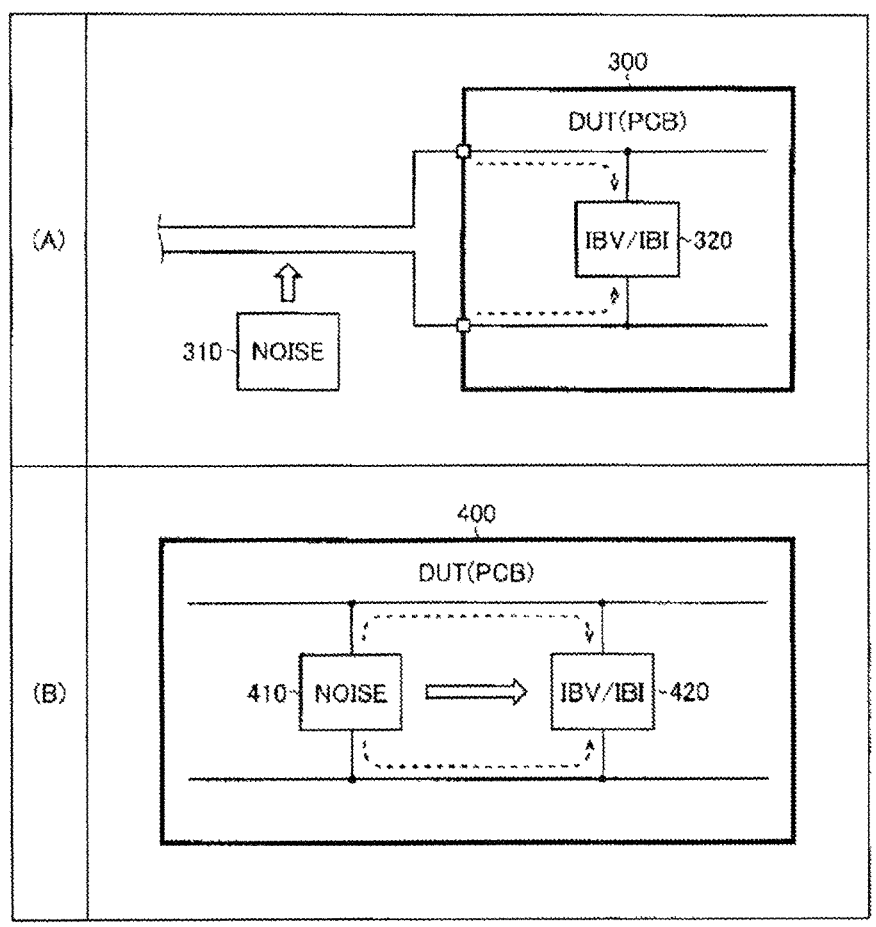
FIG. 17 is a schematic view showing inflow paths of an external noise and an internal noise.

FIG. 17 is a schematic view showing inflow paths of an external noise and an internal noise. In the EMC (Electro-Magnetic Compatibility) model described so far, as shown in section (A) of this figure, by injecting an external noise signal from an external noise source 310 into an electric circuit 320, an evaluation for a device under test 300 (or the electric circuit 320) is performed.

On the other hand, as shown in section (B) of this figure, in a device under test 400 including a first electric circuit 410 acting as a noise source and a second electric circuit 420 which is likely to malfunction due to a noise signal (so-called victim), it is important to evaluate an effect by an internal noise signal arriving at the second electric circuit 420 from the first electric circuit 410, as well as an effect by an external noise signal.

For example, even though the internal noise signal is smaller than the external noise signal at the time point when it is output from the noise source, the internal noise signal may become larger than the external noise signal at the time point when the internal noise signal arrives at the second electric circuit 420, depending on the configuration of the device under test 400 (wiring patterns, arrangement layout of various electronic components, positional relationship between the first electric circuit 410 and the second electric circuit 420, etc.). In this case, it is insufficient to only perform an evaluation for malfunction due to the external noise signal. In this case, it is also necessary to obtain sufficient information relating to malfunction caused by the internal noise signal.

Figure 18:
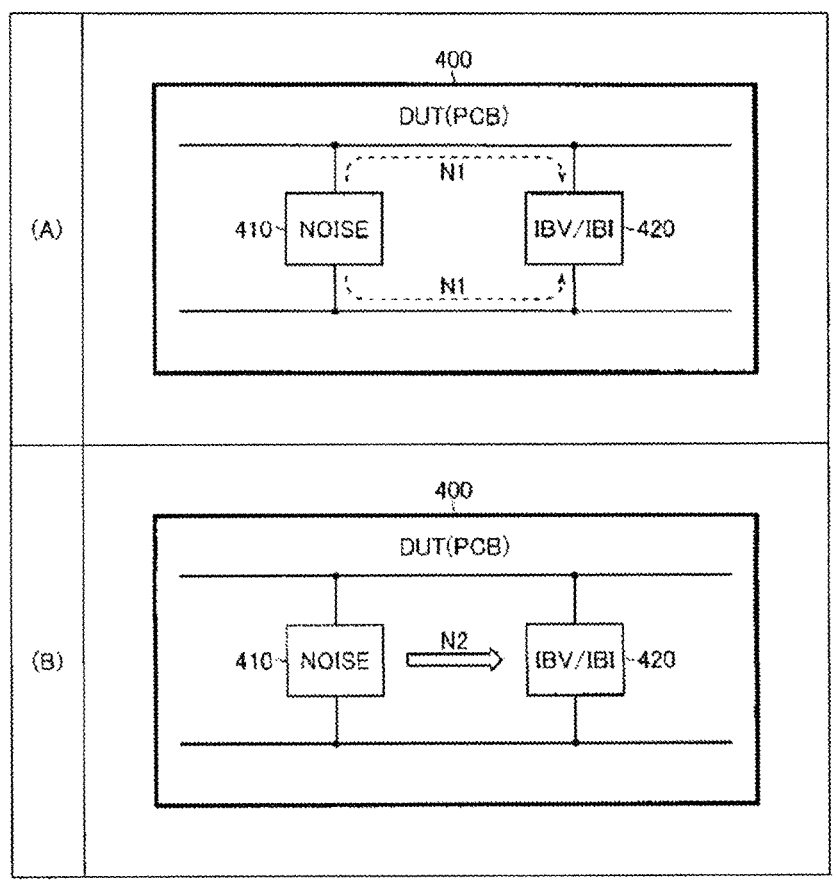
FIG. 18 is a schematic view showing inflow paths of a conductive noise and a radiative noise.

FIG. 18 is a schematic view showing inflow paths of a conductive noise and a radiative noise. As shown in section (A) of this figure, the first electric circuit 410 scatters a conductive noise N1 into a power supply system or a GND system in the device under test 400 by a temporary change in current consumption at a normal operation of the first electric circuit 410. This causes a fluctuation of the power supply or GND system, which may result in malfunctioning of the second electric circuit 420.

In addition, as shown in section (B) of this figure, a radiative noise N2 propagates from the first electric circuit 410 into the second electric circuit 420 via a direct coupling therebetween. For example, in some cases, an electric field and a magnetic field may be radiated from the first electric circuit 410 through a coupling of the first electric circuit 410 and a printed circuit board (e.g., capacitance (C) and mutual inductance (M) are coupled between the first electric circuit 410 and a printed circuit board) and may be received in the second electric circuit 420 through a coupling of the second electric circuit 420 and the printed circuit board.

Thus, the internal noise signal from the first electric circuit 410 into the second electric circuit 420 may include the conductive noise N1 and the radiative noise N2. In particular, the conductive noise N1 propagating from a ground of the first electric circuit 410 into a ground of the second electric circuit 420 is likely to cause malfunctioning of the second electric circuit 420. Therefore, it is beneficial to perform a malfunction evaluation based on the internal noise signal.

Figure 19:
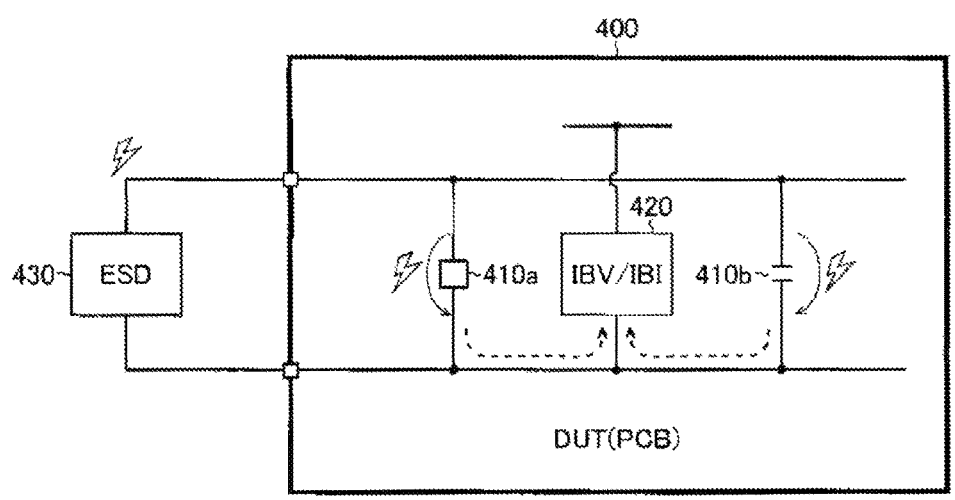
FIG. 19 is a schematic view showing one example of a secondary noise source by ESD.

FIG. 19 is a schematic view showing one example of a secondary noise source involved in ESD (Electro-Static Discharge). Examples of the noise source included in the device under test 400 may include, for example, power reduction and GND rising following high voltage driving of loads, and abnormal impulsive currents due to ESD, in addition to the above-described transient change in power consumption of the first electric circuit 410. In particular, even though the ESD stress is applied from the outside of the device under test 400, if secondary or tertiary ESD is generated inside the device under test 400, the discharge thereof may act as a new noise source (corresponding to first electric circuits 410a and 410b).

Figure 20:
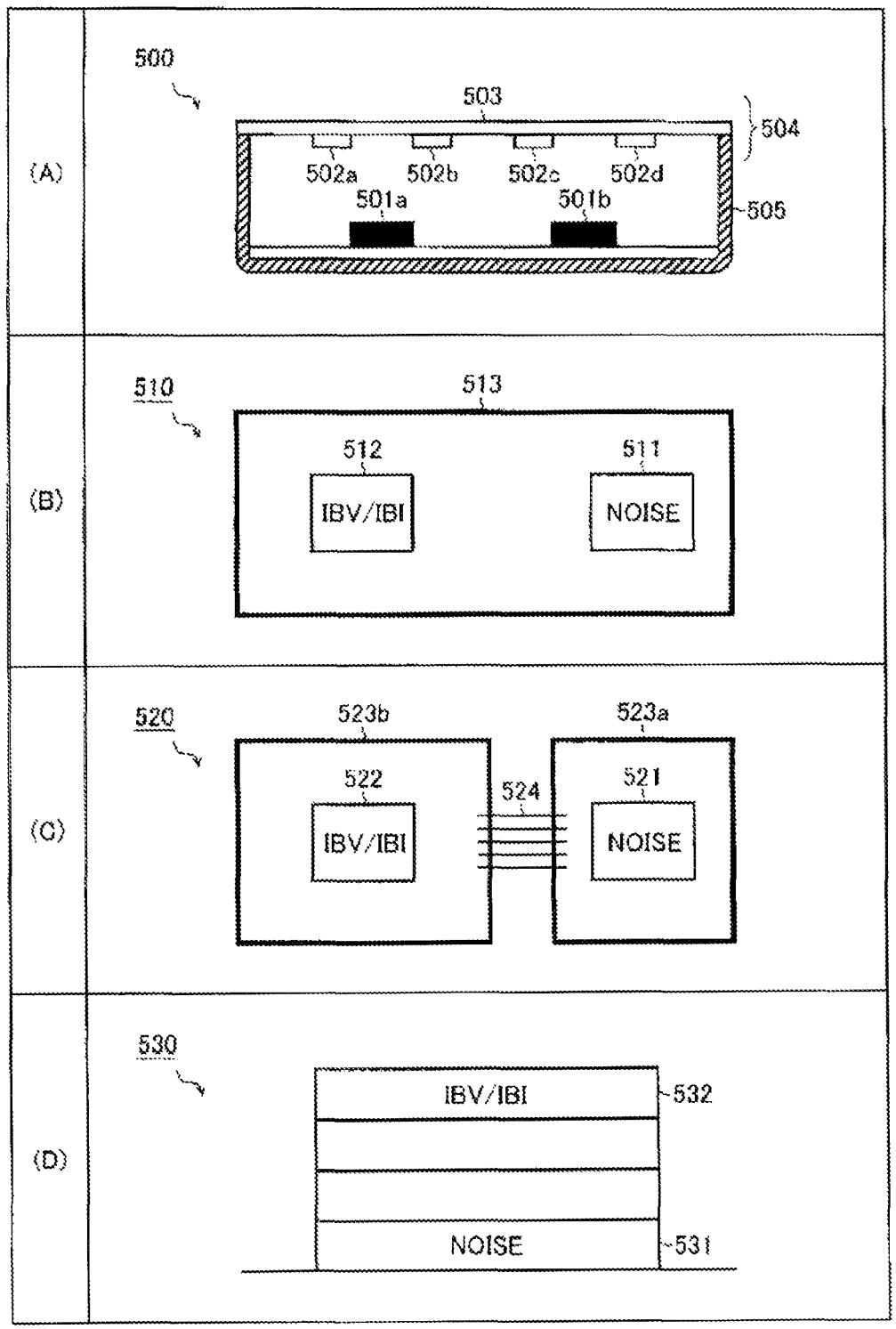
FIG. 20 is a schematic view showing a positional relationship between a noise source and an electric circuit.

FIG. 20 is a schematic view showing a positional relationship between a noise source and an electric circuit. Section (A) in this figure shows a device 500 having a modular structure including first electric circuits 501a and 501b (for example, power devices) acting as a noise source and second electric circuits 502a to 502d (for example, control chips) which are likely to malfunction due to a noise signal. In more detail, the device 500 of this configuration example is depicted as a module (for example, a power supply module) including a system board 504 including a printed circuit board 503 and the second electric circuits 502a to 502d mounted on the printed circuit board 503, the first electric circuits 501a and 501b separated from the system board 504, and a case 505 sealing the system board 504 and the first electric circuits 501a and 501b.

Section (B) in this figure shows a device 510 including a single printed circuit board 513 on which a first electric circuit 511 acting as a noise source and a second electric circuit 512 which is likely to malfunction due to a noise signal are mounted.

Section (C) in this figure shows a device 520 including a plurality of printed circuit boards 523a and 523b on each of which a first electric circuit 521 acting as a noise source and a second electric circuit 522 which is likely to malfunction due to a noise signal are mounted respectively. The printed circuit boards 523a and 523b are coupled to each other by cables 524.

Section (D) in this figure shows a device 530 including a stacked LSI including a first electric circuit 531 acting as a noise source, and a second electric circuit 532 which is likely to malfunction due to a noise signal, with both circuits 531 and 532 arranged on different layers of the stacked LSI.

Figure 21:
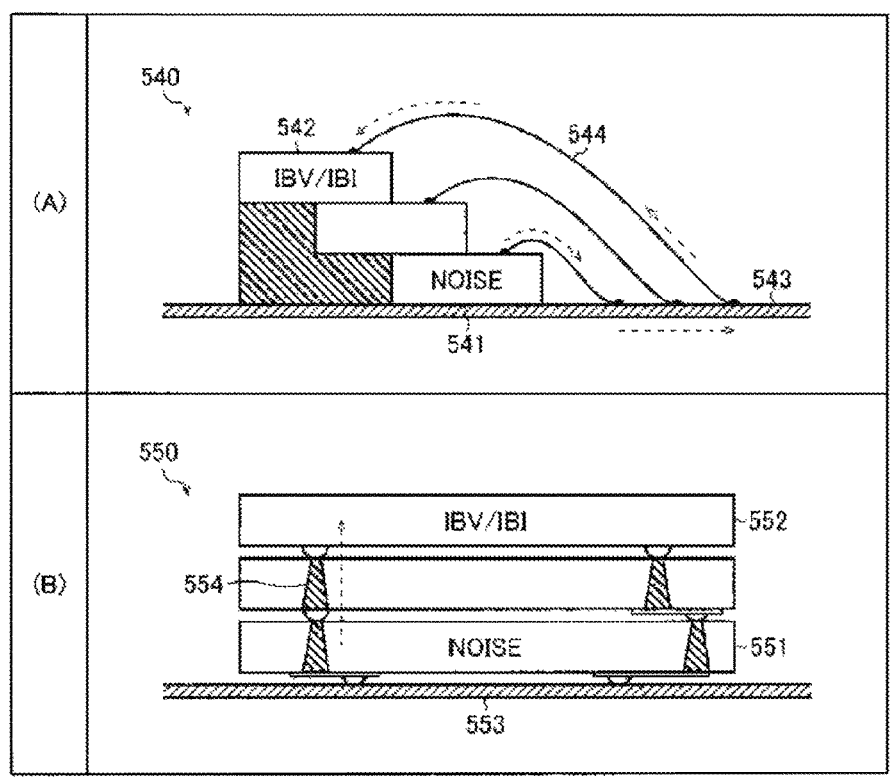
FIG. 21 is a schematic view showing a variation of the stacked LSI.

FIG. 21 is a schematic view showing various examples of the stacked LSI. Section (A) in this figure shows a device 540, which is a wire bonding (W/B) type stacked LSI, including a printed circuit board 543, a first electric circuit 541 acting as a noise source, and a second electric circuit 542 which is likely to malfunction due to a noise signal, with both circuits 541 and 542 stacked on the printed circuit board 543. The first electric circuit 541 and the second electric circuit 542 are connected to the printed circuit board 543 via bonding wires 544.

Section (B) in this figure shows a device 550, which is a through-via type stacked LSI, including a printed circuit board 553, a first electric circuit 551 acting as a noise source, and a second electric circuit 552 which is likely to malfunction due to a noise signal, with both circuits 551 and 552 stacked on the printed circuit board 553. The first electric circuit 551 and the second electric circuit 552 are electrically connected to each other through vias 554.

As described above, the positional relationship between the first electric circuit (noise source) and the second electric circuit (victim) may be vastly varied in each device. Therefore, even if the first electric circuit and the second electric circuit incorporated in each device are of same type, each magnitude of an internal noise arriving at the second electric circuit from the first electric circuit may be different for each different device so that a noise-resistant design required may be different for each different device. In addition, different noise-resistant designs for the internal noise necessarily result in changing magnitude of an external noise signal arriving at the second electric circuit. Therefore, in order to provide a proper noise-resistant design for each device, it is important to perform an evaluation for characteristics for the internal noise signal as well as evaluation for characteristics for the external noise signal.

A method of evaluating characteristics for an internal noise signal will now be described. As shown in FIG. 18, in evaluating the device under test 400 including the first electric circuit 410 acting as a noise source and the second electric circuit 420 which is likely to malfunction due to a noise signal, in a first step, malfunction frequency characteristics indicating the magnitudes of a threshold noise signal causing malfunction of the second electric circuit 420 are obtained. The malfunction frequency characteristics correspond to the DPI test result described above. That is, the malfunction frequency characteristics obtained in the first step includes malfunction current frequency characteristics indicating the magnitudes of the threshold noise signal causing malfunction of the second electric circuit 420 as currents flowing into a certain portion of the second electric circuit 420 and malfunction voltage frequency characteristics indicating the magnitudes of the threshold noise signal causing malfunction of the second electric circuit 420 as voltages applied between certain points of the second electric circuit 420 (see a solid line in FIG. 22 and solid lines in FIGS. 6 and 7).

Next, in a second step, internal noise arrival frequency characteristics indicating the magnitude of an internal noise signal arriving at the second electric circuit 420 from the first electric circuit 410 are obtained. The internal noise arrival frequency characteristics includes arrival current frequency characteristics indicating currents flowing into a certain portion of the second electric circuit 420 when the internal noise signal arrives at the certain portion and arrival voltage frequency characteristics indicating voltages applied between certain points of the second electric circuit 420 when the internal noise signal arrives between the certain points (see a dashed line in FIG. 22). The internal noise arrival frequency characteristics may be obtained based on measured noise characteristics of the first electric circuit 410 (for example, a test result based on IEC61967-4 (1Ω/150Ω method (VDE method)), an equivalent circuit of the first electric circuit 410 (which matches with the measured noise characteristics) and an equivalent circuit of the entire device under test 400. The equivalent circuit of the first electric circuit 410 and the equivalent circuit of the entire device under test 400 are based on results of comparing the measurements with S parameters.

Next, in a third step, the earlier-described malfunction frequency characteristics are compared with the internal noise arrival frequency characteristics. From this comparison, for example, it may be determined that the second electric circuit 420 may malfunction due to the internal noise signal from the first electric circuit 410 at an oscillation frequency at which the dashed line is above the solid line in FIG. 22. Thus, it is possible to improve a circuit design (noise-resistant design) quickly.

Examples of the noise-resistant design may include (1) suppressing an internal noise signal itself appearing on the ground of the first electric circuit 410, (2) suppressing propagation of the internal noise signal from the first electric circuit 410 into the second electric circuit 420, (3) separating the ground of the second electric circuit 420 from the ground of the first electric circuit 410, (4) mounting the first electric circuit 410 and the second electric circuit 420 respectively on different printed circuit boards and coupling the boards to each other by cables, (5) strengthening malfunction resistance of the second electric circuit 420, and (6) providing a suppressing means for stabilizing the ground of the second electric circuit 420 against fluctuation of the ground of the first electric circuit 410.

In addition, preferably, the characteristics evaluation of the device under test 400 may include a step of obtaining external noise arrival frequency characteristics indicating the magnitudes of an external noise signal arriving at the second electric circuit 420 from the outside of the device under test 400, and a step of comparing the earlier-described malfunction frequency characteristics with the external noise arrival frequency characteristics. The external noise arrival frequency characteristics include arrival current frequency characteristics indicating currents flowing into a certain portion of the second electric circuit 420 when the external noise signal arrives at the certain portion and arrival voltage frequency characteristics indicating voltages applied between certain points of the second electric circuit 420 when the external noise signal arrives between the certain points (see a dashed-dotted line in FIG. 22 or a dashed line in FIG. 7).

Figure 22:
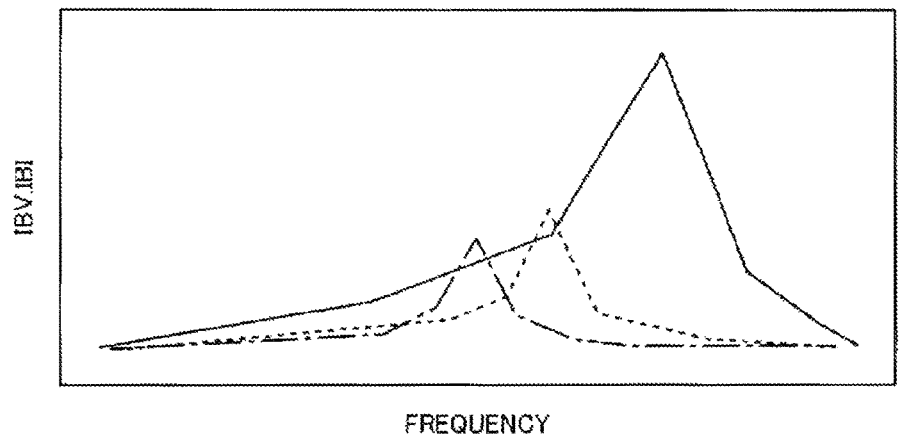
FIG. 22 is a view showing arrival frequency characteristics of an external noise and an internal noise.

From this comparison, it may be determined that the second electric circuit 420 may malfunction due to the external noise signal at an oscillation frequency at which the dashed-dotted line is above the solid line in FIG. 22. Thus, it is possible to improve a circuit design (noise-resistant design) quickly. In addition, as described earlier, different noise-resistant designs for the internal noise result in changing magnitudes of the external noise signal arriving at the second electric circuit 420. Therefore, by understanding the correlation between the internal noise arrival frequency characteristics and the external noise arrival frequency characteristics, it is possible to provide an efficient noise-resistant design of the device under test 400.

In addition, the malfunction frequency characteristics (see the solid line in FIG. 22) and the internal noise arrival frequency characteristics (see the dashed line in FIG. 22) of the second electric circuit 420 may be provided to a user, as data indicating the relationship between the magnitudes of the internal noise signal arriving at the second electric circuit 420 from the first electric circuit 410 and the malfunction of the second electric circuit 420, along with the device 400. With this data provided, it is allowed to provide a user with quality assurance (confirmation that a normal operation of the first electric circuit 410 will not cause malfunction of the second electric circuit 420) of the device 400.

Moreover, the external noise arrival frequency characteristics (see the dashed-dotted line in FIG. 22) may be provided to a user, along with the device 400. This data provided may be utilized by a user to prevent the device 400 from malfunctioning. In particular, if the user is provided with all of the above-mentioned three kinds of data, the user can understand the malfunction frequency characteristics, internal noise arrival frequency characteristics and external noise arrival frequency characteristics of the second electric circuit 420 in association, which can result in more efficient noise-resistant design for the device 400.

<Other Modifications>

Various technical features in the specification may be modified in different ways without departing from the spirit and scope of the present disclosure, in addition to the above embodiments. That is, the above embodiments are not limitative but only illustrative in all aspects. The technical scope of the disclosure is defined by the claims, rather than the above embodiments. Therefore, it is to be understood that the technical scope of the disclosure covers all modifications belonging to the claims and their equivalents According to the present disclosure in some embodiments, it is possible to provide a method of evaluating a device, which is capable of correctly detecting device malfunction due to a noise source, thereby providing an efficient noise-resistant design for the device.

According to the present disclosure in some embodiments, it is possible to correctly detect device malfunction due to a noise source and achieve a proper noise-resistant design of devices.

The present disclosure can be applied to a variety of fields including EMS verification for vehicle LSIs.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for testing a device including a first electric circuit and a second electric circuit, comprising:
   providing electric power, which varies within a predetermined range, from a signal generator to the second electric circuit;

measuring, by an oscilloscope, an output waveform of the second electric circuit generated in response to providing the electric power to provide a measured output waveform;

obtaining, by a controller, power frequency characteristics of the second electric circuit from the measured output waveform, the power frequency characteristics including threshold powers that cause malfunction of the second electric circuit;

obtaining, by the controller, current frequency characteristics of the second electric circuit from the power frequency characteristics and an equivalent circuit of the second electric circuit, the current frequency characteristics including threshold currents that flow at a portion of the second electric circuit and cause the malfunction of the second electric circuit;

deriving, by the controller, internal noise arrival current frequency characteristics from an equivalent circuit of the first electric circuit that matches noise characteristics of the first electric circuit and an equivalent circuit of the device, the internal noise arrival current frequency characteristics including internal noise currents flowing from the first electric circuit into the portion of the second electric circuit; and determining, by the controller, whether an internal noise signal from the first electric circuit causes the second electric circuit to malfunction by comparing the current frequency characteristics with the internal noise arrival current frequency characteristics.

2. The method of claim 1, wherein the equivalent circuit of the first electric circuit, the equivalent circuit of the second electric circuit, and the equivalent circuit of the device are respectively based on S parameters.

3. The method of claim 1, wherein the determined power frequency characteristics are a DPI (Direct RF Power Injection) test result.

4. The method of claim 1, further comprising:

determining, by the controller, voltage frequency characteristics of the second electric circuit based on the determined power frequency characteristics and the equivalent circuit of the second electric circuit, the voltage frequency characteristics including threshold voltages that are applied between certain points of the second electric circuit and cause the malfunction of the second electric circuit;

determining, by the controller, internal noise arrival voltage frequency characteristics based on the equivalent circuit of the first electric circuit and the equivalent circuit of the device, the internal noise arrival voltage frequency characteristics including internal noise voltages being applied between the certain points of the second electric circuit by the first electric circuit; and determining, by the controller, whether the internal noise signal from the first electric circuit causes the second electric circuit to malfunction by comparing the determined voltage frequency characteristics with the determined internal noise arrival voltage frequency characteristics.

5. The method of claim 4, wherein the equivalent circuit of the first electric circuit, the equivalent circuit of the second electric circuit, and the equivalent circuit of the device are respectively based on S parameters.

6. The method of claim 4, wherein the determined power frequency characteristics are a DPI (Direct RF Power Injection) test result.

7. A device set, comprising:
a device including a first electric circuit and a second electric circuit; and a data provision part including:
a signal generator configured to provide electric power, which varies within a predetermined range, to the second electric circuit;
an oscilloscope configured to measure an output waveform of the second electric circuit generated in response to the electric power provided by the signal generator; and a controller configured to:
obtain power frequency characteristics of the second electric circuit from the output waveform measured by the oscilloscope, the power frequency characteristics including threshold powers that cause malfunction of the second electric circuit;
obtain current frequency characteristics of the second electric circuit from the determined power frequency characteristics and an equivalent circuit of the second electric circuit, the current frequency characteristics including threshold currents that flow at a certain portion of the second electric circuit and cause the malfunction of the second electric circuit;
derive internal noise arrival current frequency characteristics from an equivalent circuit of the first electric circuit that matches noise characteristics of the first electric circuit and an equivalent circuit of the device, the internal noise arrival current frequency characteristics including internal noise currents flowing into the certain portion of the second electric circuit; and
provide data including the current frequency characteristics and the internal noise arrival current frequency characteristics.

8. The device set of claim 7, wherein the controller is further configured to:
determine voltage frequency characteristics of the second electric circuit based on the determined power frequency characteristics and the equivalent circuit of the second electric circuit, the voltage frequency characteristics including threshold voltages that are applied between certain points of the second electric circuit and cause the malfunction of the second electric circuit;
determine internal noise arrival voltage frequency characteristics based on the equivalent circuit of the first electric circuit and the equivalent circuit of the device, the internal noise arrival voltage frequency characteristics including internal noise voltages being applied between the certain points of the second electric circuit by the first electric circuit; and
provide the determined voltage frequency characteristics and the determined internal noise arrival voltage frequency characteristics.

9. A method for testing a device including a first electric circuit and a second electric circuit, comprising:
provide electric power, which varies within a predetermined range, from a signal generator to the second electric circuit;
measuring, by an oscilloscope, an output waveform of the second electric circuit generated in response to providing the electric power to provide a measured output waveform;
obtaining, by a controller, power frequency characteristics of the second electric circuit from the measured output waveform, the power frequency characteristics including threshold powers that cause malfunction of the second electric circuit;
obtaining, by the controller, voltage frequency characteristics of the second electric circuit from the determined power frequency characteristics and an equivalent circuit of the second electric circuit, the voltage frequency characteristics including threshold voltages that are applied between points of the second electric circuit and cause the malfunction of the second electric circuit;

deriving, by the controller, internal noise arrival voltage frequency characteristics from an equivalent circuit of the first electric circuit that matches noise characteristics of the first electric circuit and an equivalent circuit of the device, the internal noise arrival voltage frequency characteristics including internal noise voltages being applied between the points of the second electric circuit by the first electric circuit; and determining, by the controller, whether an internal noise signal causes the second electric circuit to malfunction by comparing the voltage frequency characteristics with the internal noise arrival voltage frequency characteristics.

10. The method of claim 9, wherein the equivalent circuit of the first electric circuit, the equivalent circuit of the second electric circuit, and the equivalent circuit of the device are respectively based on S parameters.

11. The method of claim 9, wherein the determined power frequency characteristics are a DPI (Direct RF Power Injection) test result.

12. A device set, comprising:
a device including a first electric circuit and a second electric circuit; and
a data provision part that includes a signal generator, an oscilloscope, and a controller, wherein the signal generator is configured to provide electric power, which varies within a predetermined range, into the second electric circuit, the oscilloscope is configured to measure an output waveform of the second electric circuit generated in response to the electric power provided by the signal generator, and the controller is configured to obtain power frequency characteristics of the second electric circuit from the output waveform measured by the oscilloscope, the power frequency characteristics including threshold powers being injected into the second electric circuit;

obtain voltage frequency characteristics of the second electric circuit from the determined power frequency characteristics and an equivalent circuit of the second electric circuit, the voltage frequency characteristics including threshold voltages that are applied between points of the second electric circuit and cause malfunction of the second electric circuit;

derive internal noise arrival voltage frequency characteristics from an equivalent circuit of the first electric circuit that matches noise characteristics of the first electric circuit and an equivalent circuit of the device, the internal noise arrival voltage frequency characteristics including internal noise voltages being applied between the points of the second electric circuit by the first electric circuit; and provide data including the voltage frequency characteristics and the internal noise arrival voltage frequency characteristics.

* * * * *